United States Patent
Agarwal et al.

(10) Patent No.: US 11,371,148 B2
(45) Date of Patent: Jun. 28, 2022

(54) FABRICATING A RECURSIVE FLOW GAS DISTRIBUTION STACK USING MULTIPLE LAYERS

(71) Applicant: Applied Materials, Inc., Santa Clara, CA (US)

(72) Inventors: Sumit Agarwal, Dublin, CA (US); Anantha K Subramani, San Jose, CA (US); Yang Guo, Santa Clara, CA (US); Siva Chandrasekar, Hosur (IN)

(73) Assignee: Applied Materials, Inc., Santa Clara, CA (US)

( * ) Notice: Subject to any disclaimer, the term of this patent is extended or adjusted under 35 U.S.C. 154(b) by 123 days.

(21) Appl. No.: 17/001,551

(22) Filed: Aug. 24, 2020

(65) Prior Publication Data

US 2022/0056584 A1 Feb. 24, 2022

(51) Int. Cl.
*G06K 9/62* (2022.01)
*C23C 16/52* (2006.01)
*C23C 16/455* (2006.01)
*G06N 20/00* (2019.01)

(52) U.S. Cl.
CPC ........ *C23C 16/52* (2013.01); *C23C 16/45544* (2013.01); *G06K 9/6256* (2013.01); *G06K 9/6262* (2013.01); *G06N 20/00* (2019.01)

(58) Field of Classification Search
CPC .......... C23C 16/52; C23C 16/45544; G06K 9/6256; G06K 9/6262; G06N 20/00
See application file for complete search history.

(56) References Cited

U.S. PATENT DOCUMENTS

| | | | |
|---|---|---|---|
| 2010/0170438 A1 | 7/2010 | Saywell et al. | |
| 2012/0061351 A1* | 3/2012 | Ohata | H01J 37/32642 156/345.24 |
| 2017/0365443 A1 | 12/2017 | Carducci et al. | |
| 2020/0308703 A1 | 10/2020 | Agarwal et al. | |

FOREIGN PATENT DOCUMENTS

| | | |
|---|---|---|
| JP | 2011100882 A | 5/2011 |
| JP | 2014054710 A | 3/2014 |
| WO | 2014018336 A1 | 1/2014 |

OTHER PUBLICATIONS

International Search Report and Written Opinion dated Dec. 16, 2021 for PCT Application No. PCT/US2021/047194.

\* cited by examiner

*Primary Examiner* — Kyoung Lee
(74) *Attorney, Agent, or Firm* — Lowenstein Sandler LLP

(57) ABSTRACT

A method includes receiving one or more parameters associated with a plurality of metal plates. The method further includes determining, based on the one or more parameters, a plurality of predicted deformation values associated with the plurality of metal plates. Each of the plurality of predicted deformation values correspond to a corresponding metal plate of the plurality of metal plates. The method further includes causing, based on the plurality of predicted deformation values, the plurality of metal plates to be diffusion bonded to produce a bonded metal plate structure.

20 Claims, 7 Drawing Sheets

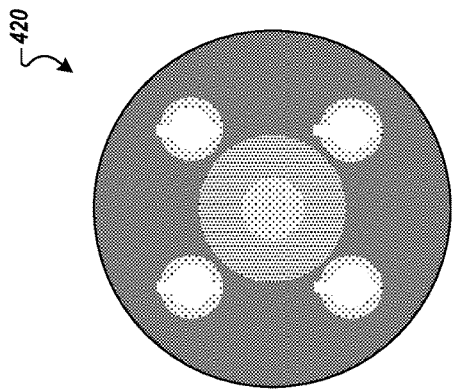
FIG. 4D
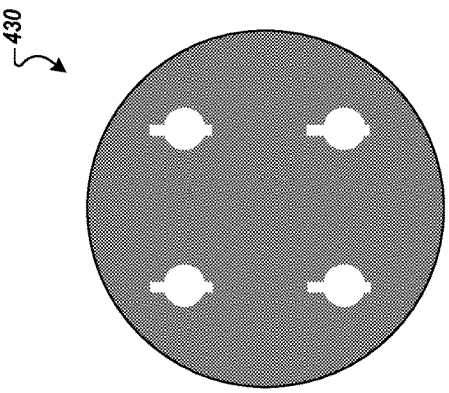
FIG. 4E
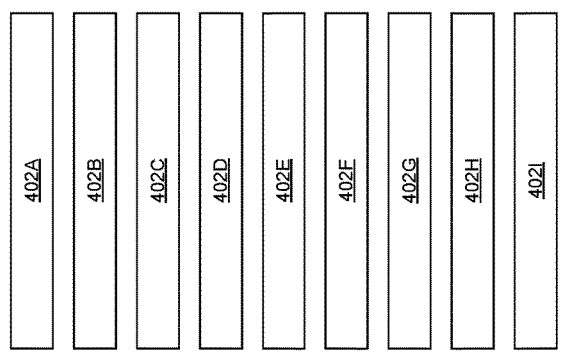
FIG. 4B
FIG. 4C
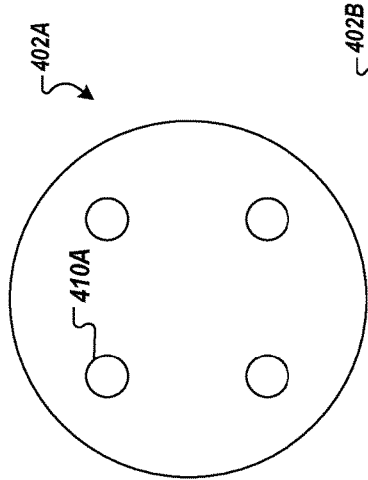
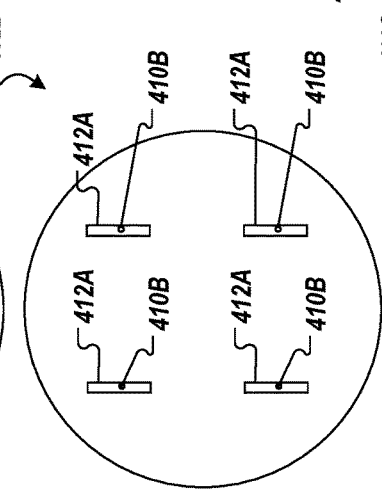
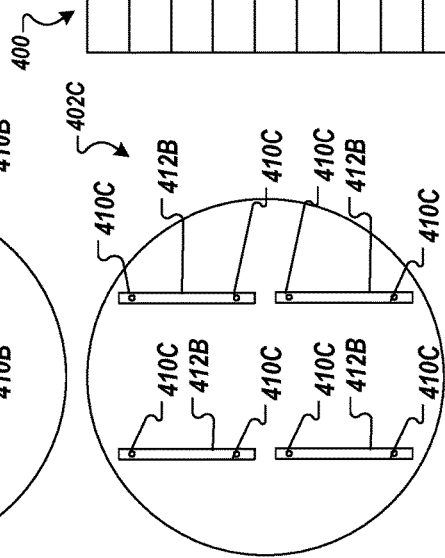
FIG. 4A

FABRICATING A RECURSIVE FLOW GAS DISTRIBUTION STACK USING MULTIPLE LAYERS

TECHNICAL FIELD

The present disclosure relates to fabrication, and, more particularly, fabrication using multiple layers.

BACKGROUND

Manufacturing systems, such as substrate processing systems, include components for producing products. Some components are multiple layers of material secured to each other. Some of the multi-layer components form channels providing flow to a processing chamber.

SUMMARY

The following is a simplified summary of the disclosure in order to provide a basic understanding of some aspects of the disclosure. This summary is not an extensive overview of the disclosure. It is intended to neither identify key or critical elements of the disclosure, nor delineate any scope of the particular implementations of the disclosure or any scope of the claims. Its sole purpose is to present some concepts of the disclosure in a simplified form as a prelude to the more detailed description that is presented later.

In an aspect of the disclosure, a method includes receiving one or more parameters associated with a plurality of metal plates. The method further includes determining, based on the one or more parameters, a plurality of predicted deformation values associated with the plurality of metal plates. Each of the plurality of predicted deformation values correspond to a corresponding metal plate of the plurality of metal plates. The method further includes causing, based on the plurality of predicted deformation values, the plurality of metal plates to be diffusion bonded to produce a bonded metal plate structure.

In another aspect of the disclosure, a non-transitory machine-readable storage medium storing instructions which, when executed cause a processing device to perform operations including receiving one or more parameters associated with a plurality of metal plates. The operations further include determining, based on the one or more parameters, a plurality of predicted deformation values associated with the plurality of metal plates. Each of the plurality of predicted deformation values correspond to a corresponding metal plate of the plurality of metal plates. The operations further include causing, based on the plurality of predicted deformation values, the plurality of metal plates to be diffusion bonded to produce a bonded metal plate structure.

In another aspect of the disclosure, a system includes a memory and a processing device coupled to the memory. The processing device is to receive one or more parameters associated with a plurality of metal plates. The processing device is further to determine, based on the one or more parameters, a plurality of predicted deformation values associated with the plurality of metal plates. Each of the plurality of predicted deformation values corresponding to a corresponding metal plate of the plurality of metal plates. The processing device is further to cause, based on the plurality of predicted deformation values, the plurality of metal plates to be diffusion bonded to produce a bonded metal plate structure.

BRIEF DESCRIPTION OF THE DRAWINGS

The present disclosure is illustrated by way of example, and not by way of limitation in the figures of the accompanying drawings.

FIGS. 4A-E illustrate metal plates, according to certain embodiments.

DETAILED DESCRIPTION

Figure 1:
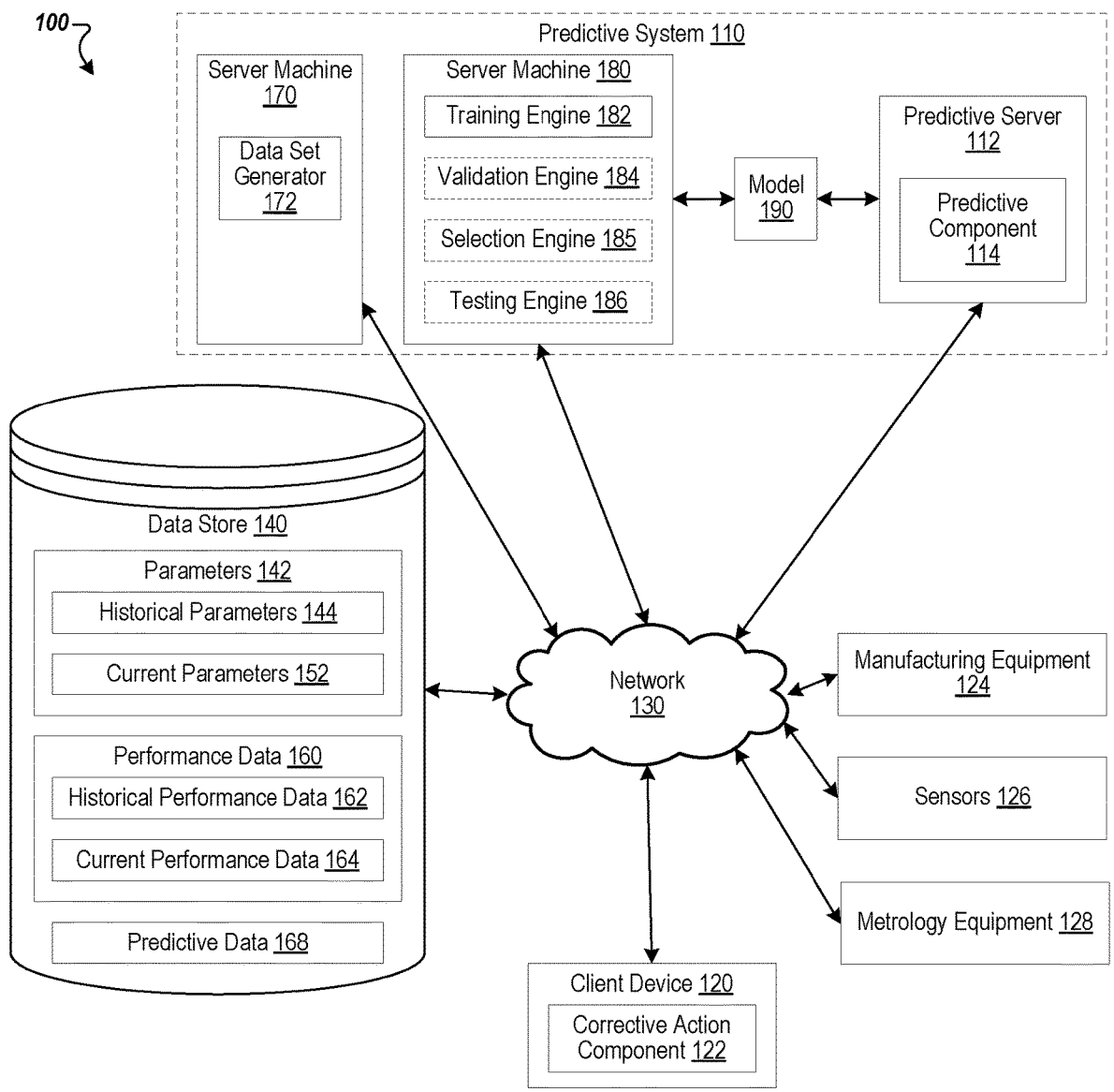
FIG. 1 is a block diagram illustrating an exemplary system architecture, according to certain embodiments.

Described herein are technologies directed to fabricating a recursive flow gas distribution stack (e.g., bonded metal plate structure, showerhead, etc.) using multiple layers.

Manufacturing systems, such as substrate processing systems, include components for producing products. Some components are multiple layers of material secured to each other. Some of the multi-layer components form channels providing flow to a processing chamber. For example, some showerheads configured to provide gas flow to a processing chamber of a substrate processing chamber are made of layers of material.

Conventionally, metallic layers (e.g., aluminum) are brazed or welded together using filler material which causes particle and trace metal contamination. Conventional layered components include a portion that is brazed or welded using filler material and a portion that is coupled to the brazed or welded portion via seals or gaskets. Components made by these conventional methods have slower flow (e.g., reduced gas purge time). For example if 100 pairs of nitride and oxide processes are to be performed for a substrate, there would be 200 purge operations. Longer gas purge time for each of the 200 purge operations for each substrate creates an increased time to produce substrates, which decreases yield and increases energy consumption. Components made by the conventional methods have particles (e.g., from the filler material) that become dislodge causing substrates to become contaminated and decreasing yield and quality.

The devices, systems, and methods disclosed herein provide fabrication of a recursive flow gas distribution stack (e.g., bonded metal plate structure, showerhead, etc.) using multiple layers. A processing device receives parameters associated with metal plates. The parameters include one or more of dimensions of the metal plates, hole patterns of the metal plates, design of the metal plates, pressure for diffusion bonding the metal plates, temperature for diffusion bonding the metal plates, subsets of the metal plates to diffusion bond separately, cooling rate for heat treating the bonded metal plate structure, and/or the like. The processing device determines, based on the one or more parameters, predicted deformation values associated with the metal plates. In some examples, the processing device determines a predicted deformation value for each metal plate at a pressure value. The processing device causes the metal plates to be diffusion bonded to produce a metal plate structure based on the predicted deformation values. Responsive to each of the predicted deformation values meeting a threshold value (e.g., being less than deflection of a gasket, such as an O-ring, to be used with the bonded metal plate structure), the processing device causes all of the metal plates to be diffusion bonded together at the same time (e.g., at a higher pressure). Responsive to a predicted deformation value not meeting the threshold value (e.g., being greater than deflection of a gasket, such as an O-ring, to be used with the bonded metal plate structure), the processing device causes different subsets of the metal plates to be diffusion bonded together (e.g., at a lower pressure than diffusion bonding all metal plates together at the same time) to form bonded subsets and then the bonded subsets are diffusion bonded together (e.g., at a lower pressure than diffusion bonding all metal plates together at the same time).

In some embodiments, a machine learning model is trained with data input of historical parameters associated with historical metal plates and target output of historical performance data (e.g., inspection results, usage results, etc.) associated with the historical metal plates to generate a trained machine learning model. Parameters associated with producing new bonded metal plate structures are input into the trained machine learning model and corrective actions are performed based on the output (e.g., predicted performance data) of the trained machine learning model. In some embodiments, the corrective actions include updating the parameters associated with producing bonded metal plate structures, providing an alert, interrupting production of the bonded metal plate structures, and/or the like.

Aspects of the present disclosure result in technological advantages. The present disclosure provides for producing bonded metal plate structures (e.g., showerheads for processing chambers in substrate processing systems) that have an increased flow rate (e.g., lower gas purge time) than components produced by conventional methods. This increases yield and decreases energy consumption. The present disclosure provides for producing bonded metal plate structures that have less particles that become dislodged during use than components produced by conventional methods. This decreases contamination of substrates, increased yield, and increased quality of substrates. The present disclosure provides determining updated parameters for producing optimized bonded metal plate structures than conventional systems.

FIG. 1 is a block diagram illustrating an exemplary system 100 (exemplary system architecture), according to certain embodiments. The system 100 includes a client device 120, manufacturing equipment 124, sensors 126, metrology equipment 128, a predictive server 112, and a data store 140. In some embodiments, the predictive server 112 is part of a predictive system 110. In some embodiments, the predictive system 110 further includes server machines 170 and 180.

In some embodiments, one or more of the client device 120, manufacturing equipment 124, sensors 126, metrology equipment 128, predictive server 112, data store 140, server machine 170, and/or server machine 180 are coupled to each other via a network 130 for generating predictive data 168 (e.g., outputs indicative of a health of the processing chamber) to perform corrective actions. In some embodiments, network 130 is a public network that provides client device 120 with access to the predictive server 112, data store 140, and other publically available computing devices. In some embodiments, network 130 is a private network that provides client device 120 access to manufacturing equipment 124, sensors 126, metrology equipment 128, data store 140, and other privately available computing devices. In some embodiments, network 130 includes one or more Wide Area Networks (WANs), Local Area Networks (LANs), wired networks (e.g., Ethernet network), wireless networks (e.g., an 802.11 network or a Wi-Fi network), cellular networks (e.g., a Long Term Evolution (LTE) network), routers, hubs, switches, server computers, cloud computing networks, and/or a combination thereof.

In some embodiments, the client device 120 includes a computing device such as Personal Computers (PCs), laptops, mobile phones, smart phones, tablet computers, netbook computers, etc. In some embodiments, the client device 120 includes a corrective action component 122. Client device 120 includes an operating system that allows users to one or more of generate, view, or edit data (e.g., indication associated with manufacturing equipment 124, corrective actions associated with manufacturing equipment 124, etc.).

In some embodiments, corrective action component 122 receives user input (e.g., via a Graphical User Interface (GUI) displayed via the client device 120) of an indication associated with manufacturing equipment 124. In some embodiments, the corrective action component 122 transmits the indication to the predictive system 110, receives output (e.g., predictive data 168) from the predictive system 110, determines a corrective action associated with the manufacturing equipment 124 based on the output, and causes the corrective action to be implemented. In some embodiments, the corrective action component 122 obtains parameters 142 (e.g., current parameters 152) associated with the manufacturing equipment 124 (e.g., from data store 140, etc.) and provides the parameters 142 (e.g., current parameters 152) associated with the manufacturing equipment 124 to the predictive system 110. In some embodiments, the corrective action component 122 stores parameters 142 in the data store 140 and the predictive server 112 retrieves the parameters 142 from the data store 140. In some embodiments, the predictive server 112 stores output (e.g., predictive data 168) of the trained machine learning model 190 in the data store 140 and the client device 120 retrieves the output from the data store 140. In some embodiments, the corrective action component 122 receives an indication of a corrective action from the predictive system 110 and causes the corrective action to be implemented.

In some embodiments, a corrective action is associated with one or more of Computational Process Control (CPC), Statistical Process Control (SPC) (e.g., SPC to compare to a graph of 3-sigma, etc.), Advanced Process Control (APC), model-based process control, preventative operative maintenance, design optimization, updating of manufacturing parameters, feedback control, machine learning modification, or the like.

In some embodiments, the corrective action includes updating parameters associated with production of bonded metal plate structures. In some embodiments, the corrective action includes providing an alert (e.g., an alarm to not use the bonded metal plate structure for substrate processing if the predictive data 168 indicates a predicted abnormality, such as an abnormality of the product, a component, manufacturing equipment 124, or health of the processing chamber). In some embodiments, the corrective action includes providing feedback control (e.g., modifying parameters responsive to the predictive data 168 indicating a predicted abnormality). In some embodiments, the corrective action includes providing machine learning (e.g., causing modification of one or more parameters of production of the bonded metal plate structures based on the predictive data 168).

In some embodiments, the predictive server 112, server machine 170, and server machine 180 each include one or more computing devices such as a rackmount server, a router computer, a server computer, a personal computer, a mainframe computer, a laptop computer, a tablet computer, a desktop computer, Graphics Processing Unit (GPU), accelerator Application-Specific Integrated Circuit (ASIC) (e.g., Tensor Processing Unit (TPU)), etc.

The predictive server 112 includes a predictive component 114. In some embodiments, the predictive component 114 receives parameters 142 (e.g., receive from the client device 120, retrieve from the data store 140) and generates output (e.g., predictive data 168) for performing corrective action associated with the manufacturing equipment 124 based on the parameters 142. In some embodiments, the predictive component 114 uses one or more trained machine learning models 190 to determine the output for performing the corrective action based on the parameters 142. In some embodiments, trained machine learning model 190 is trained using historical parameters 144 and historical performance data 162.

In some embodiments, the predictive system 110 (e.g., predictive server 112, predictive component 114) generates predictive data 168 using supervised machine learning (e.g., supervised data set, performance data 160 includes an indication of whether the processing chamber had errors in calibration and/or installation, etc.). In some embodiments, the predictive system 110 generates predictive data 168 using semi-supervised learning (e.g., semi-supervised data set, performance data 160 is a predictive percentage, etc.). In some embodiments, the predictive system 110 generates predictive data 168 using unsupervised machine learning (e.g., unsupervised data set, clustering, clustering based on performance data 160, etc.).

In some embodiments, the manufacturing equipment 124 (e.g., cluster tool) is part of a substrate processing system (e.g., integrated processing system). The manufacturing equipment 124 includes one or more of a controller, an enclosure system (e.g., substrate carrier, front opening unified pod (FOUP), autoteach FOUP, process kit enclosure system, substrate enclosure system, cassette, etc.), a side storage pod (SSP), an aligner device (e.g., aligner chamber), a factory interface (e.g., equipment front end module (EFEM)), a load lock, a transfer chamber, one or more processing chambers, a robot arm (e.g., disposed in the transfer chamber, disposed in the front interface, etc.), and/or the like. The enclosure system, SSP, and load lock mount to the factory interface and a robot arm disposed in the factory interface is to transfer content (e.g., substrates, process kit rings, carriers, validation wafer, etc.) between the enclosure system, SSP, load lock, and factory interface. The aligner device is disposed in the factory interface to align the content. The load lock and the processing chambers mount to the transfer chamber and a robot arm disposed in the transfer chamber is to transfer content (e.g., substrates, process kit rings, carriers, validation wafer, etc.) between the load lock, the processing chambers, and the transfer chamber. In some embodiments, the manufacturing equipment 124 includes components of substrate processing systems. In some embodiments, the manufacturing equipment 124 is used to produce one or more components to be used in substrate processing systems. In some embodiments, the manufacturing equipment 124 is used to produce and/or includes a bonded metal plate structure (e.g., showerhead to be used in a processing chamber of a substrate processing system).

In some embodiments, the sensors 126 provide parameters 142 associated with manufacturing equipment 124. In some embodiments, the sensors 126 provide sensor values (e.g., historical sensor values, current sensor values). In some embodiments, the sensors 126 include one or more of a pressure sensor, a temperature sensor, a flow rate sensor, and/or the like. In some embodiments, the parameters are used for equipment health and/or product health (e.g., product quality). In some embodiments, the parameters 142 are received over a period of time.

In some embodiments, sensors 126 include additional sensors that provide other types of parameters 142. In some embodiments, the parameters 142 includes values of one or more of leak rate, temperature, pressure, flow rate (e.g., gas flow), pumping efficiency, spacing (SP), High Frequency Radio Frequency (HFRF), electrical current, power, voltage, and/or the like. In some embodiments, parameters 142 are associated with or indicative of manufacturing parameters such as hardware parameters (e.g., settings or components, such as size, type, etc., of the manufacturing equipment 124) or process parameters of the manufacturing equipment. In some embodiments, parameters 142 are provided while the manufacturing equipment 124 performs manufacturing processes (e.g., equipment readings when processing products or components), before the manufacturing equipment 124 performs manufacturing processes, and/or after the manufacturing equipment 124 performs manufacturing processes. In some embodiments, the parameters 142 are provided while the manufacturing equipment 124 provides a sealed environment (e.g., the diffusion bonding chamber, substrate processing system, and/or processing chamber are closed.)

In some embodiments, the parameters 142 (e.g., historical parameters 144, current parameters 152, etc.) are processed (e.g., by the client device 120 and/or by the predictive server 112). In some embodiments, processing of the parameters 142 includes generating features. In some embodiments, the features are a pattern in the parameters 142 (e.g., slope, width, height, peak, etc.) or a combination of values from the parameters 142 (e.g., power derived from voltage and current, etc.). In some embodiments, the parameters 142 includes features and the features are used by the predictive component 114 for obtaining predictive data 168 for performance of a corrective action.

In some embodiments, the metrology equipment 128 is used to determine metrology data (e.g., inspection data) corresponding to products of the manufacturing equipment 124. In some examples, after the manufacturing equipment 124 diffusion bonds, heat treats, machines, surface machines, and/or the like a bonded metal plate structure and the metrology equipment 128 is used to inspect one or more portions (e.g., each bond interface) of the bonded metal plate structure. In some embodiments, the metrology equipment 128 performs one or more of scanning acoustic microscopy (SAM), ultrasonic inspection, x-ray inspection, and/or computed tomography (CT) inspection. In some examples, after the manufacturing equipment 124 deposits one or more layers on a substrate, the metrology equipment 128 is used to determine quality of the processed substrate (e.g., one or more of thicknesses of the layers, uniformity of the layers, interlayer spacing of the layer, and/or the like). In some embodiments, the metrology equipment 128 includes an imaging device (e.g., SAM equipment, ultrasonic equipment, x-ray equipment, CT equipment, and/or the like).

In some embodiments, the data store 140 is a memory (e.g., random access memory), a drive (e.g., a hard drive, a flash drive), a database system, or another type of component or device capable of storing data. In some embodiments, data store 140 includes multiple storage components (e.g., multiple drives or multiple databases) that span multiple computing devices (e.g., multiple server computers). In some embodiments, the data store 140 stores one or more of parameters 142, performance data 160, and/or predictive data 168.

Parameters 142 includes historical parameters 144 and current parameters 152. In some embodiments, the parameters include one or more of a pressure value, a pressure range, dimensions of the metal plates, design of the metal plates, a hole pattern of the metal plates, a temperature value, a temperature range, comparison parameters for comparing inspection data with threshold data, threshold data, cooling rate value, cooling rate range, and/or the like.

Performance data 160 includes historical performance data 162 and current performance data 164. In some embodiments, the performance data 160 is indicative of whether the manufacturing equipment 124 is functioning properly. In some examples, the performance data 160 is indicative of whether the bonded metal plate structure is properly designed, properly produced, and/or properly functioning. In some embodiments, at least a portion of the performance data 160 is associated with a quality of products produced by the manufacturing equipment 124. In some embodiments, at least a portion of the performance data 160 is based on metrology data from the metrology equipment 128 (e.g., historical performance data 162 indicates correctly produced bonded metal plate structures in processing chambers corresponding to metrology data indicating properly processed substrates, property data of substrates, yield, etc.). In some embodiments, at least a portion of the performance data 160 is based on inspection of the manufacturing equipment 124 (e.g., current performance data 164 based on verification of actual inspection). In some embodiments, the performance data 160 includes an indication of an absolute value (e.g., inspection data of the bond interfaces indicates missing the threshold data by a calculated value, deformation value misses the threshold deformation value by a calculated value) or a relative value (e.g., inspection data of the bond interfaces indicates missing the threshold data by 5%, deformation misses threshold deformation by 5%). In some embodiments, the performance data 160 is indicative of meeting a threshold amount of error (e.g., at least 5% error in production, at least 5% error in flow, at least 5% error in deformation, specification limit).

In some embodiments, the client device 120 provides performance data 160 (e.g., product data, equipment data). In some examples, the client device 120 provides (e.g., based on user input) performance data 160 that indicates an abnormality in products (e.g., defective products) and/or manufacturing equipment 124 (e.g., component failure, maintenance, energy usage, variance of a component compared to similar components, etc.). In some embodiments, the performance data 160 includes an amount of products that have been produced that were normal or abnormal (e.g., 98% normal products). In some embodiments, the performance data 160 indicates an amount of products that are being produced that are predicted as normal or abnormal. In some embodiments, the performance data 160 includes one or more of yield a previous batch of products, average yield, predicted yield, predicted amount of defective or nondefective product, or the like. In some examples, responsive to yield on a first batch of product being 98% (e.g., 98% of the products were normal and 2% were abnormal), the client device 120 provides performance data 160 indicating that the upcoming batch of product is to have a yield of 98%.

Historical data includes one or more of historical parameters 144 and/or historical performance data 162 (e.g., at least a portion for training the machine learning model 190). Current data includes one or more of current parameters 152 and/or current performance data 164 (e.g., at least a portion to be input into the trained machine learning model 190 subsequent to training the model 190 using the historical data) for which predictive data 168 is generated (e.g., for performing corrective actions). In some embodiments, the current data is used for retaining the trained machine learning model 190.

In some embodiments, the predictive data 168 is indicative of predictive performance data of manufacturing equipment 124 and/or components (e.g., bonded metal plate structures). In some examples, the predictive data 168 is indicative of predicted error in flow rate, bonding, deflection, and/or the like. In some embodiments, the predictive data 168 is indicative of whether a predicted error value is greater than an error threshold value. In some embodiments, the predictive data 168 is indicative of an absolute value or relative value of error. In some embodiments, the predictive data 168 is associated with one or more of predicted property data (e.g., of products to be produced or that have been produced using current parameters 152), predicted metrology data (e.g., virtual metrology data of the products to be produced or that have been produced using current parameters 152), an indication of abnormalities (e.g., abnormal products, abnormal components, abnormal manufacturing equipment 124, abnormal energy usage, abnormal installation, abnormal calibration, etc.), one or more causes of abnormalities or errors, and/or indication of an end of life of a component of manufacturing equipment 124.

Performing metrology on products to determine incorrectly produced components (e.g., bonded metal plate structures) is costly in terms of time used, metrology equipment 128 used, energy consumed, bandwidth used to send the metrology data, processor overhead to process the metrology data, etc. By inputting parameters 142 and receiving output of predictive data 168, system 100 has the technical advantage of avoiding the costly process of using metrology equipment 128 to generate current performance data 164 for current parameters 152.

Performing manufacturing processes (e.g., with poorly produced component, such as a poorly produced bonded metal plate structure) that result in defective products is costly in time, energy, products, components, manufacturing equipment 124, the cost of identifying the component causing the defective products, producing a new component, and discarding the old component, etc. By inputting parameters 142, receiving output of predictive data 168, and performing a corrective action based on the predictive data 168, system 100 has the technical advantage of avoiding the cost of producing, identifying, and discarding defective components.

In some embodiments, manufacturing parameters are suboptimal (e.g., incorrectly calibrated, etc.) for producing product which has costly results of increased resource (e.g., energy, coolant, gases, etc.) consumption, increased amount of time to produce the products, increased component failure, increased amounts of defective products, etc. By inputting the parameters 142 into the trained machine learning model 190, receiving an output of predictive data 168, and performing (e.g., based on the predictive data 168) a corrective action of updating manufacturing parameters, system 100 has the technical advantage of using optimal manufacturing parameters to avoid costly results of suboptimal manufacturing parameters.

In some embodiments, predictive system 110 further includes server machine 170 and server machine 180. Server machine 170 includes a data set generator 172 that is capable of generating data sets (e.g., a set of data inputs and a set of target outputs) to train, validate, and/or test a machine learning model(s) 190. Some operations of data set generator 172 are described in detail below with respect to FIGS. 2 and 5B. In some embodiments, the data set generator 172 partitions the historical data (e.g., historical parameters 144 and historical performance data 162) into a training set (e.g., sixty percent of the historical data), a validating set (e.g., twenty percent of the historical data), and a testing set (e.g., twenty percent of the historical data). In some embodiments, the predictive system 110 (e.g., via predictive component 114) generates multiple sets of features. In some examples a first set of features corresponds to a first set of types of parameters (e.g., from a first set of sensors, first combination of values from first set of sensors, first patterns in the values from the first set of sensors) that correspond to each of the data sets (e.g., training set, validation set, and testing set) and a second set of features correspond to a second set of types of parameters (e.g., from a second set of sensors different from the first set of sensors, second combination of values different from the first combination, second patterns different from the first patterns) that correspond to each of the data sets.

Server machine 180 includes a training engine 182, a validation engine 184, selection engine 185, and/or a testing engine 186. In some embodiments, an engine (e.g., training engine 182, a validation engine 184, selection engine 185, and a testing engine 186) refers to hardware (e.g., circuitry, dedicated logic, programmable logic, microcode, processing device, etc.), software (such as instructions run on a processing device, a general purpose computer system, or a dedicated machine), firmware, microcode, or a combination thereof. The training engine 182 is capable of training a machine learning model 190 using one or more sets of features associated with the training set from data set generator 172. In some embodiments, the training engine 182 generates multiple trained machine learning models 190, where each trained machine learning model 190 corresponds to a distinct set of features of the training set (e.g., parameters from a distinct set of sensors). In some examples, a first trained machine learning model was trained using all features (e.g., X1-X5), a second trained machine learning model was trained using a first subset of the features (e.g., X1, X2, X4), and a third trained machine learning model was trained using a second subset of the features (e.g., X1, X3, X4, and X5) that partially overlaps the first subset of features.

The validation engine 184 is capable of validating a trained machine learning model 190 using a corresponding set of features of the validation set from data set generator 172. For example, a first trained machine learning model 190 that was trained using a first set of features of the training set is validated using the first set of features of the validation set. The validation engine 184 determines an accuracy of each of the trained machine learning models 190 based on the corresponding sets of features of the validation set. The validation engine 184 discards trained machine learning models 190 that have an accuracy that does not meet a threshold accuracy. In some embodiments, the selection engine 185 is capable of selecting one or more trained machine learning models 190 that have an accuracy that meets a threshold accuracy. In some embodiments, the selection engine 185 is capable of selecting the trained machine learning model 190 that has the highest accuracy of the trained machine learning models 190.

The testing engine 186 is capable of testing a trained machine learning model 190 using a corresponding set of features of a testing set from data set generator 172. For example, a first trained machine learning model 190 that was trained using a first set of features of the training set is tested using the first set of features of the testing set. The testing engine 186 determines a trained machine learning model 190 that has the highest accuracy of all of the trained machine learning models based on the testing sets.

In some embodiments, the machine learning model 190 refers to the model artifact that is created by the training engine 182 using a training set that includes data inputs and corresponding target outputs (correct answers for respective training inputs). Patterns in the data sets can be found that map the data input to the target output (the correct answer), and the machine learning model 190 is provided mappings that captures these patterns. In some embodiments, the machine learning model 190 uses one or more of Support Vector Machine (SVM), Radial Basis Function (RBF), clustering, supervised machine learning, semi-supervised machine learning, unsupervised machine learning, k-Nearest Neighbor algorithm (k-NN), linear regression, random forest, neural network (e.g., artificial neural network), etc. In some embodiments, the machine learning model 190 is a multi-variable analysis (MVA) model.

Predictive component 114 provides current parameters 152 to the trained machine learning model 190 and runs the trained machine learning model 190 on the input to obtain one or more outputs. The predictive component 114 is capable of determining (e.g., extracting) predictive data 168 from the output of the trained machine learning model 190 and determines (e.g., extract) confidence data from the output that indicates a level of confidence that the predictive data 168 corresponds to current performance data 164 (e.g., model 190) of the manufacturing equipment 124 at the current parameters 152. In some embodiments, the predictive component 114 or corrective action component 122 use the confidence data to decide whether to cause a corrective action associated with the manufacturing equipment 124 based on the predictive data 168.

The confidence data includes or indicates a level of confidence that the predictive data 168 corresponds to current performance data 164 (e.g., model 190) of the manufacturing equipment 124 at the current parameters 152. In one example, the level of confidence is a real number between 0 and 1 inclusive, where 0 indicates no confidence that the predictive data 168 corresponds to current performance data 164 associated with the current parameters 152 and 1 indicates absolute confidence that the predictive data 168 corresponds to current performance data 164 associated with the current parameters 152. In some embodiments, the system 100 uses predictive system 110 to determine predictive data 168 instead of processing substrates and using the metrology equipment 128 to determine current performance data 164. In some embodiments, responsive to the confidence data indicating a level of confidence that is below a threshold level, the system 100 causes processing of substrates and causes the metrology equipment 128 to generate the current performance data 164. Responsive to the confidence data indicating a level of confidence below a threshold level for a predetermined number of instances (e.g., percentage of instances, frequency of instances, total number of instances, etc.) the predictive component 114 causes the trained machine learning model 190 to be re-trained (e.g., based on the current parameters 152 and current performance data 164, etc.).

Figure 2:
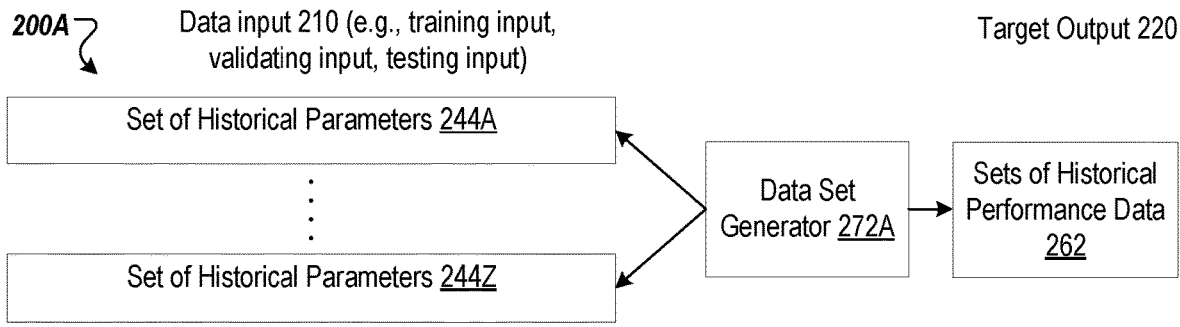
FIG. 2 illustrates a data set generator to create data sets for a machine learning model, according to certain embodiments.

For purpose of illustration, rather than limitation, aspects of the disclosure describe the training of one or more machine learning models 190 using historical data (e.g., historical parameters 144 and historical performance data 162) and inputting current data (e.g., current parameters 152) into the one or more trained machine learning models 190 to determine predictive data 168 (e.g., current performance data 164). In other implementations, a heuristic model or rule-based model is used to determine predictive data 168 (e.g., without using a trained machine learning model). Predictive component 114 monitors historical parameters 144 and historical performance data 162. In some embodiments, any of the information described with respect to data inputs 210 of FIG. 2 are monitored or otherwise used in the heuristic or rule-based model.

In some embodiments, the functions of client device 120, predictive server 112, server machine 170, and server machine 180 are be provided by a fewer number of machines. For example, in some embodiments, server machines 170 and 180 are integrated into a single machine, while in some other embodiments, server machine 170, server machine 180, and predictive server 112 are integrated into a single machine. In some embodiments, client device 120 and predictive server 112 are integrated into a single machine.

In general, functions described in one embodiment as being performed by client device 120, predictive server 112, server machine 170, and server machine 180 can also be performed on predictive server 112 in other embodiments, if appropriate. In addition, the functionality attributed to a particular component can be performed by different or multiple components operating together. For example, in some embodiments, the predictive server 112 determines the corrective action based on the predictive data 168. In another example, client device 120 determines the predictive data 168 based on output from the trained machine learning model.

In addition, the functions of a particular component can be performed by different or multiple components operating together. In some embodiments, one or more of the predictive server 112, server machine 170, or server machine 180 are accessed as a service provided to other systems or devices through appropriate application programming interfaces (API).

In some embodiments, a "user" is represented as a single individual. However, other embodiments of the disclosure encompass a "user" being an entity controlled by a plurality of users and/or an automated source. In some examples, a set of individual users federated as a group of administrators is considered a "user."

Although embodiments of the disclosure are discussed in terms of generating predictive data 168 to perform a corrective action in manufacturing facilities (e.g., substrate processing facilities), in some embodiments, the disclosure can also be generally applied to verifying correct parameters of producing components. Embodiments can be generally applied to verifying parameters (e.g., design parameters, production parameters, etc.) based on different types of data.

FIG. 2 illustrates a data set generator 272 (e.g., data set generator 172 of FIG. 1) to create data sets for a machine learning model (e.g., model 190 of FIG. 1), according to certain embodiments. In some embodiments, data set generator 272 is part of server machine 170 of FIG. 1.

Data set generator 272 (e.g., data set generator 172 of FIG. 1) creates data sets for a machine learning model (e.g., model 190 of FIG. 1). Data set generator 272 creates data sets using historical parameters 244 (e.g., historical parameters 144 of FIG. 1) and historical performance data 262 (e.g., historical performance data 162 of FIG. 1). System 200 of FIG. 2 shows data set generator 272, data inputs 210, and target output 220.

In some embodiments, data set generator 272 generates a data set (e.g., training set, validating set, testing set) that includes one or more data inputs 210 (e.g., training input, validating input, testing input) and one or more target outputs 220 that correspond to the data inputs 210. The data set also includes mapping data that maps the data inputs 210 to the target outputs 220. Data inputs 210 are also referred to as "features," "attributes," or information." In some embodiments, data set generator 272 provides the data set to the training engine 182, validating engine 184, or testing engine 186, where the data set is used to train, validate, or test the machine learning model 190. Some embodiments of generating a training set are further described with respect to FIG. 5B.

In some embodiments, data set generator 272 generates the data input 210 and target output 220. In some embodiments, data inputs 210 include one or more sets of historical parameters 244. In some embodiments, historical parameters 244 include one or more of parameters from one or more types of sensors, combination of parameters from one or more types of sensors, patterns from parameters from one or more types of sensors, dimensions of metal plates, and/or the like.

In some embodiments, data set generator 272 generates a first data input corresponding to a first set of historical parameters 244A to train, validate, or test a first machine learning model and the data set generator 272 generates a second data input corresponding to a second set of historical parameters 244B to train, validate, or test a second machine learning model.

In some embodiments, the data set generator 272 discretizes (e.g., segments) one or more of the data input 210 or the target output 220 (e.g., to use in classification algorithms for regression problems). Discretization (e.g., segmentation via a sliding window) of the data input 210 or target output 220 transforms continuous values of variables into discrete values. In some embodiments, the discrete values for the data input 210 indicate discrete historical parameters 244 to obtain a target output 220 (e.g., discrete performance data 262).

Data inputs 210 and target outputs 220 to train, validate, or test a machine learning model include information for a particular facility (e.g., for a particular substrate manufacturing facility). In some examples, historical parameters 244 and historical performance data 262 are for the same manufacturing facility.

In some embodiments, the information used to train the machine learning model is from specific types of manufacturing equipment 124 of the manufacturing facility having specific characteristics and allow the trained machine learning model to determine outcomes for a specific group of manufacturing equipment 124 based on input for current parameters (e.g., current parameters 152) associated with one or more components sharing characteristics of the specific group. In some embodiments, the information used to train the machine learning model is for components from two or more manufacturing facilities and allows the trained machine learning model to determine outcomes for components based on input from one manufacturing facility.

In some embodiments, subsequent to generating a data set and training, validating, or testing a machine learning model 190 using the data set, the machine learning model 190 is further trained, validated, or tested (e.g., current performance data 164 of FIG. 1) or adjusted (e.g., adjusting weights associated with input data of the machine learning model 190, such as connection weights in a neural network).

Figure 3:
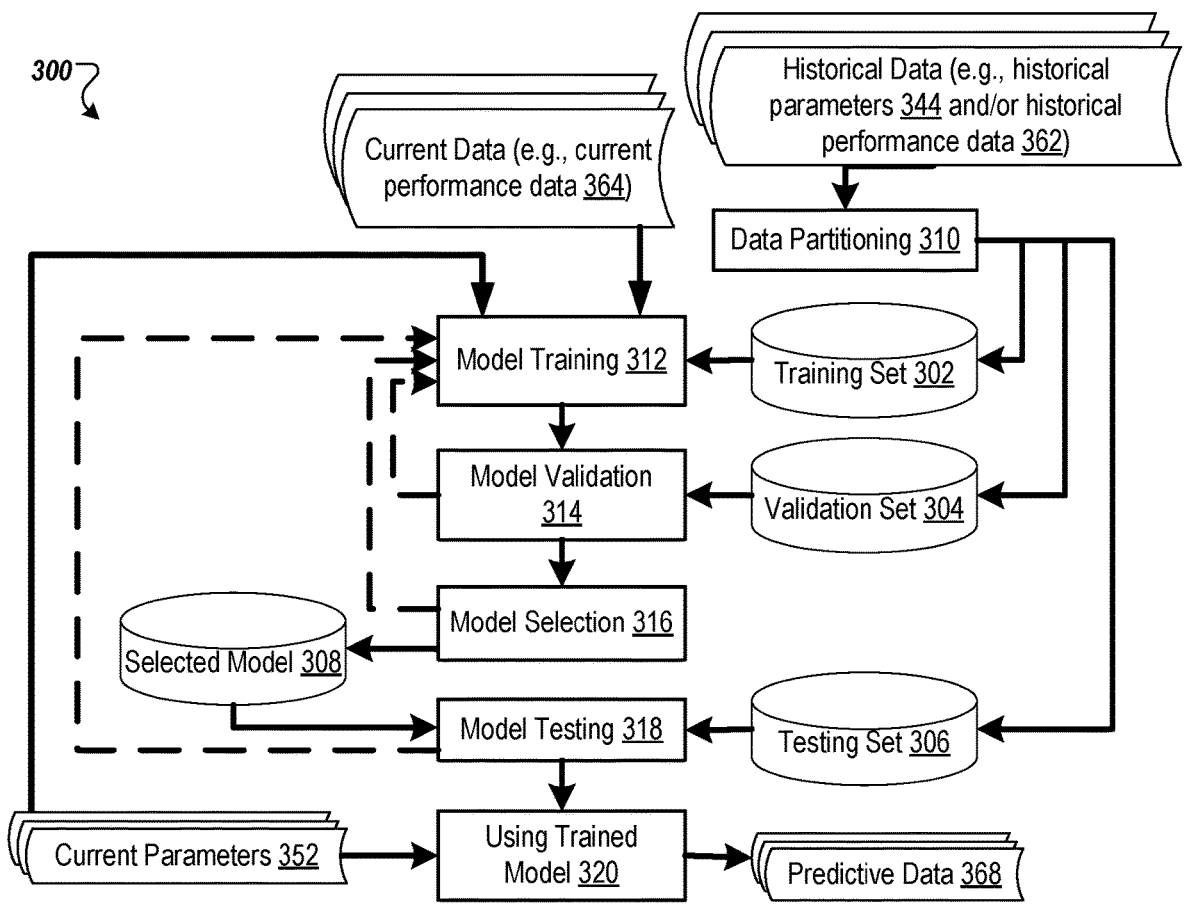
FIG. 3 is a block diagram illustrating determining predictive data, according to certain embodiments.

FIG. 3 is a block diagram illustrating a system 300 for generating predictive data 368 (e.g., predictive data 168 of FIG. 1), according to certain embodiments. The system 300 is used to determine predictive data 368 (e.g., model 190 of FIG. 1) to cause a corrective action (e.g., associated with manufacturing equipment 124, associated with production of bonded metal plate structures).

At block 310, the system 300 (e.g., predictive system 110 of FIG. 1) performs data partitioning (e.g., via data set generator 172 of server machine 170 of FIG. 1) of the historical data (e.g., historical parameters 344 and historical performance data 362 for model 190 of FIG. 1) to generate the training set 302, validation set 304, and testing set 306. In some examples, the training set is 60% of the historical data, the validation set is 20% of the historical data, and the testing set is 20% of the historical data. The system 300 generates a plurality of sets of features for each of the training set, the validation set, and the testing set. In some examples, if the historical data includes features derived from parameters from 20 sensors (e.g., sensors 126 of FIG. 1) and 100 products (e.g., products that each correspond to the parameters from the 20 sensors), a first set of features is sensors 1-10, a second set of features is sensors 11-20, the training set is products 1-60, the validation set is products 61-80, and the testing set is products 81-100. In this example, the first set of features of the training set would be parameters from sensors 1-10 for products 1-60.

At block 312, the system 300 performs model training (e.g., via training engine 182 of FIG. 1) using the training set 302. In some embodiments, the system 300 trains multiple models using multiple sets of features of the training set 302 (e.g., a first set of features of the training set 302, a second set of features of the training set 302, etc.). For example, system 300 trains a machine learning model to generate a first trained machine learning model using the first set of features in the training set (e.g., parameters from sensors 1-10 for products 1-60) and to generate a second trained machine learning model using the second set of features in the training set (e.g., parameters from sensors 11-20 for products 1-60). In some embodiments, the first trained machine learning model and the second trained machine learning model are combined to generate a third trained machine learning model (e.g., which is a better predictor than the first or the second trained machine learning model on its own in some embodiments). In some embodiments, sets of features used in comparing models overlap (e.g., first set of features being parameters from sensors 1-15 and second set of features being sensors 5-20). In some embodiments, hundreds of models are generated including models with various permutations of features and combinations of models.

At block 314, the system 300 performs model validation (e.g., via validation engine 184 of FIG. 1) using the validation set 304. The system 300 validates each of the trained models using a corresponding set of features of the validation set 304. For example, system 300 validates the first trained machine learning model using the first set of features in the validation set (e.g., parameters from sensors 1-10 for products 61-80) and the second trained machine learning model using the second set of features in the validation set (e.g., parameters from sensors 11-20 for products 61-80). In some embodiments, the system 300 validates hundreds of models (e.g., models with various permutations of features, combinations of models, etc.) generated at block 312. At block 314, the system 300 determines an accuracy of each of the one or more trained models (e.g., via model validation) and determines whether one or more of the trained models has an accuracy that meets a threshold accuracy. Responsive to determining that none of the trained models has an accuracy that meets a threshold accuracy, flow returns to block 312 where the system 300 performs model training using different sets of features of the training set. Responsive to determining that one or more of the trained models has an accuracy that meets a threshold accuracy, flow continues to block 316. The system 300 discards the trained machine learning models that have an accuracy that is below the threshold accuracy (e.g., based on the validation set).

At block 316, the system 300 performs model selection (e.g., via selection engine 185 of FIG. 1) to determine which of the one or more trained models that meet the threshold accuracy has the highest accuracy (e.g., the selected model 308, based on the validating of block 314). Responsive to determining that two or more of the trained models that meet the threshold accuracy have the same accuracy, flow returns to block 312 where the system 300 performs model training using further refined training sets corresponding to further refined sets of features for determining a trained model that has the highest accuracy.

At block 318, the system 300 performs model testing (e.g., via testing engine 186 of FIG. 1) using the testing set 306 to test the selected model 308. The system 300 tests, using the first set of features in the testing set (e.g., parameters from sensors 1-10 for products 81-100), the first trained machine learning model to determine the first trained machine learning model meets a threshold accuracy (e.g., based on the first set of features of the testing set 306). Responsive to accuracy of the selected model 308 not meeting the threshold accuracy (e.g., the selected model 308 is overly fit to the training set 302 and/or validation set 304 and is not applicable to other data sets such as the testing set 306), flow continues to block 312 where the system 300 performs model training (e.g., retraining) using different training sets corresponding to different sets of features (e.g., parameters from different sensors). Responsive to determining that the selected model 308 has an accuracy that meets a threshold accuracy based on the testing set 306, flow continues to block 320. In at least block 312, the model learns patterns in the historical data to make predictions and in block 318, the system 300 applies the model on the remaining data (e.g., testing set 306) to test the predictions.

At block 320, system 300 uses the trained model (e.g., selected model 308) to receive current parameters 352 (e.g., current parameters 152 of FIG. 1) and determines (e.g., extracts), from the output of the trained model, predictive data 368 (e.g., predictive data 168 of FIG. 1) to perform corrective actions associated with the manufacturing equipment 124 and/or production of bonded metal plate structures. In some embodiments, the current parameters 352 corresponds to the same types of features in the historical parameters. In some embodiments, the current parameters 352 corresponds to a same type of features as a subset of the types of features in historical parameters that are used to train the selected model 308.

In some embodiments, current data is received. In some embodiments, current data includes current performance data 364 (e.g., current performance data 164 of FIG. 1). In some embodiments, the current data is received from metrology equipment (e.g., metrology equipment 128 of FIG. 1) or via user input. The model 308 is re-trained based on the current data. In some embodiments, a new model is trained based on the current data and the current parameters 352.

In some embodiments, one or more of the operations 310-320 occur in various orders and/or with other operations not presented and described herein. In some embodiments, one or more of operations 310-320 are not be performed. For example, in some embodiments, one or more of data partitioning of block 310, model validation of block 314, model selection of block 316, and/or model testing of block 318 are not be performed.

FIGS. 4A-E illustrate metal plates 402, according to certain embodiments. FIG. 4A illustrates a top view of metal plates 402A-C, according to certain embodiments. FIG. 4B illustrates a side view of metal plates 402A-I, according to certain embodiments. FIG. 4C illustrates a side view of a bonded metal plate structure 400 including metal plates 402A-I, according to certain embodiments. FIG. 4D is an image 420 of a bond interface 404A (e.g., bond interface 404A between metal plates 402A and 402B) of a bonded metal plate structure 400, according to certain embodiments. FIG. 4E is an image 430 of a default bond interface 404A of a bonded plate structure 400, according to certain embodiments.

In some embodiments, the metal plates 402 are made of one or more of aluminum (e.g., aluminum 6061, aluminum alloy, nickel, nickel alloy, and/or iron alloy. In some embodiments, metal plates 402 are referred to as layers. In some embodiments, the bonded metal plate structure 400 is a gas distribution stack fabricated using discrete individual layers bonded together using diffusion bonding. In some embodiments, the entire stack is coated with a layer (e.g., an oxide and/or ceramic layer, such as aluminum oxide) after fabrication using a chemical vapor deposition (CVD) or atomic layer deposition (ALD) based process. In some embodiments, the bonded metal plate structure 400 is selectively coated (e.g., to avoid coating inside surfaces of holes and channels) by purging with gases during an ALD coating process. In some embodiments, the bonded metal plate structure 400 is formed by an incremental method that uses incremental addition of metal plates 402 to reach the entire thickness and eliminates use of discrete components and O-rings of conventional structures.

In some embodiments, two or more metal plates 402 are to be diffusion bonded together. In some embodiments, three or more metal plates 402 are to be diffusion bonded together. In some embodiments, five or more metal plates 402 are to be diffusion bonded together. In some embodiments, eight or more metal plates 402 are to be diffusion bonded together. In some embodiments, nine or more metal plates 402 are to be diffusion bonded together. In some embodiments, the diffusion bonding is without additional material (e.g., filler material, seals, gaskets, O-rings, and/or the like) in contact with the metal plates 402. Conventional systems use additional material (e.g., filler material, filler material with high silicon content) that can get corroded during use in a processing chamber (e.g., gets corroded in in halogen plasmas). The diffusion bonded metal plates 402 avoid corrosion of joint interface of conventional systems (e.g., by not using filler material), avoids particles, and decreases trace metals.

In some embodiments, the bonded metal plate structure 400 includes one or more of a gas distribution stack, a recursive flow gas distribution stack, a showerhead, a component to provide flow in a processing chamber of a substrate processing system, a heater plate, a shield plate, a structure with an embedded heater, a structure forming channels (e.g., for cooling, heating, providing fluid flow, etc.), a layered structure, a laminated structure, etc. Conventionally, a showerhead stack includes different components (e.g., blocker plate, faceplate, etc.) are separate components (e.g., not bonded together) that are joined via seals and O-rings which causes gas flow through the showerhead stack to be slow (e.g., takes more than two seconds to purge out gases after a process operation is completed), causes non-uniformity, and throttles conductance. In some embodiments, the bonded metal plate structure 400 is a full showerhead stack that is diffusion bonded together (e.g., does not include separate blocker plate, faceplate, etc.) which causes faster gas flow through the showerhead stack (e.g., less than about 0.2 seconds to purge gases out of the showerhead stack after a process operation is completed, about 90% decrease in time to purge gases out of the showerhead stack after a process operation is completed), causes increased uniformity, and increased conductance. In some embodiments, a bonded metal plate structure 400 is used to deposit about 200 layers on a substrate that alternate (e.g., one oxide layer and then one nitride layer and then one oxide layer, etc.). The faster gas flow through the bonded metal plate structure 400 results in much less time being used to produce a substrate than conventional systems. In some embodiments, the bonded metal plate structure 400 has flow that is more laminar (e.g., less turbulence) than conventional structures.

In some embodiments, the manufacturing process (e.g., method 500A) allows additional layers to be added which creates new isolated plenums without adding any seals or gaskets (e.g., O-rings). In some embodiments, the bonded metal plate structure 400 is a non-consumable showerhead stack where a consumable screen (e.g., low-cost consumable screen) is used to protect the showerhead from process cavity.

In some embodiments, the bonded metal plate structure 400 is a showerhead for CVD or ALD in a processing chamber of a substrate processing system. In some embodiments, the showerhead has a gas purge time of about 0.2 seconds or less. In some embodiments, the bonded metal plate structure 400 has uniform gas flow at high conductance. In some embodiments, the bonded metal plate structure 400 has two or more flow channels to isolate reactive gas chemistries. In some embodiments, the bonded metal plate structure 400 is a non-consumable showerhead stack (e.g., with improved defect performance, has less defects than conventional showerhead stacks). In some embodiments, the bonded metal plate structure 400 is a monolithic stack (e.g., of nine layers).

In some embodiments, the metal plates 402 have a circular perimeter (e.g., are cylindrically shaped). In some embodiments, one or more of the metal plates 402 form holes 410 (e.g., channels that go from a top surface to a bottom surface of a metal plate 402) and/or recesses 412 (e.g., that go from a surface of a metal plate 402 partially through the metal plate 402).

In some embodiments, two or more metal plates have different patterns (e.g., different sizes, different quantities, etc.) of holes 410 and/or recesses 412. In some embodiments, the bonded metal plate structure 400 has isolated channels (e.g., plenums, internal channels, flow channels) formed by the holes 410 and/or recesses 412 (e.g., without using seals, gaskets, and/or O-rings). In some embodiments, the bonded metal plate structure 400 (e.g., including isolated plenums) is formed without adding any seals and/or gaskets (e.g., O-rings). In some embodiments, two or more channels are isolated from each other (e.g., reactive gas chemistries from different channels do not mix with each other within the bonded metal plate structure 400).

In some embodiments, the metal plates 402 have alignment features (e.g., recesses and protrusions, such as pins) that cause the metal plates 402 to be aligned. In some examples, upper surfaces of one or more of the metal plates 402 have alignment features, such as protrusions (e.g., pins that are press fit onto the metal plates), and lower surfaces of one or more of the metal plates 402 form alignment features, such as recesses (e.g., drilled and/or machined into the lower surfaces). The protrusions fit into the recesses to align the metal plates 402.

A pressure (e.g., pressure value, pressure range) is selected for diffusion bonding the metal plates 402 that corresponds to predicted deformation of the metal plates 402 (e.g., alignment features of the metal plates, etc.) not exceeding a threshold value.

The metal plates 402 are diffusion bonded together without filler material to generate a bonded metal plate structure 400 that has metal plates 402 bonded together at bond interfaces 404A-H. In some embodiments, the bond interfaces 404A-H are inspected to determine performance data of the bonded metal plate structure 400.

Referring to FIGS. 4D-E, image 420 is an image (e.g., SAM image, CT image, x-ray image, etc.) of a bond interface 404A of a bonded metal plate structure 400. In some embodiments, image 430 is an image of a default bond interface 404A of a default bonded metal plate structure (e.g., a bonded metal state structure that is properly functioning, properly bonded, etc.). In some embodiments images 420 and 430 have darker portions corresponding to a stronger diffusion bond and lighter portions corresponding to a weaker or no diffusion bond.

In some embodiments, image 430 is generated (e.g., based on default parameters, based on a trained machine learning model, etc.). In some embodiments, image 430 has threshold pixel values. The image 420 is compared to image 430 (e.g., comparing pixel by pixel) to determine variation between image 420 and image 430. Responsive to the variation meeting (e.g., being less than) a threshold variation (e.g., comparison parameters), the bonded metal plate structure is used. Responsive to the variation not meeting (e.g., being greater than) a threshold variation (e.g., comparison parameters), a corrective action is performed (e.g., discard the bonded metal plate structure, updating parameters, etc.).

As shown in FIG. 4E, image 430 has lighter portions corresponding to the recesses 412A of metal plate 402B and the holes 410 of metal plate 402A (e.g., where metal plates 402A-B do not diffusion bond to each other. As shown in FIG. 4D, image 420 has lighter portions corresponding to the recesses 412A of metal plate 402B, the holes 410 of metal plate 402A, an area surrounding the recess 412A of metal plate 402B, and a central area (e.g., where metal plates 402A-B have a weaker diffusion bond or no diffusion bond). The images 420 and 430 are compared (e.g., pixel by pixel) to determine a variation and comparison parameters (e.g., threshold variation) are used to determine whether a corrective action is to be performed.

FIGS. 5A-D are flow diagrams of methods 500A-D associated with production of a bonded metal plate structure, according to certain embodiments. In some embodiments, methods 500A-D are performed by processing logic that includes hardware (e.g., circuitry, dedicated logic, programmable logic, microcode, processing device, etc.), software (such as instructions run on a processing device, a general purpose computer system, or a dedicated machine), firmware, microcode, or a combination thereof. In some embodiments, methods 500A-D are performed, at least in part, by predictive system 110. In some embodiments, method 500A is performed, at least in part, by one or more of predictive system 110 (e.g., predictive server 112, predictive component 114), client device 120 (e.g., corrective action component), manufacturing equipment 124, and/or metrology equipment 128. In some embodiments, method 500B is performed, at least in part, by predictive system 110 (e.g., server machine 170 and data set generator 172 of FIG. 1, data set generator 272 of FIG. 2). In some embodiments, predictive system 110 uses method 500B to generate a data set to at least one of train, validate, or test a machine learning model. In some embodiments, method 500C is performed by server machine 180 (e.g., training engine 182, etc.). In some embodiments, method 500D is performed by predictive server 112 (e.g., predictive component 114). In some embodiments, a non-transitory storage medium stores instructions that when executed by a processing device (e.g., of predictive system 110, of server machine 180, of predictive server 112, etc.), cause the processing device to perform one or more of methods 500A-D.

For simplicity of explanation, methods 500A-D are depicted and described as a series of operations. However, operations in accordance with this disclosure can occur in various orders and/or concurrently and with other operations not presented and described herein. Furthermore, in some embodiments, not all illustrated operations are performed to implement methods 500A-D in accordance with the disclosed subject matter. In addition, those skilled in the art will understand and appreciate that methods 500A-D could alternatively be represented as a series of interrelated states via a state diagram or events.

Figure 5A:
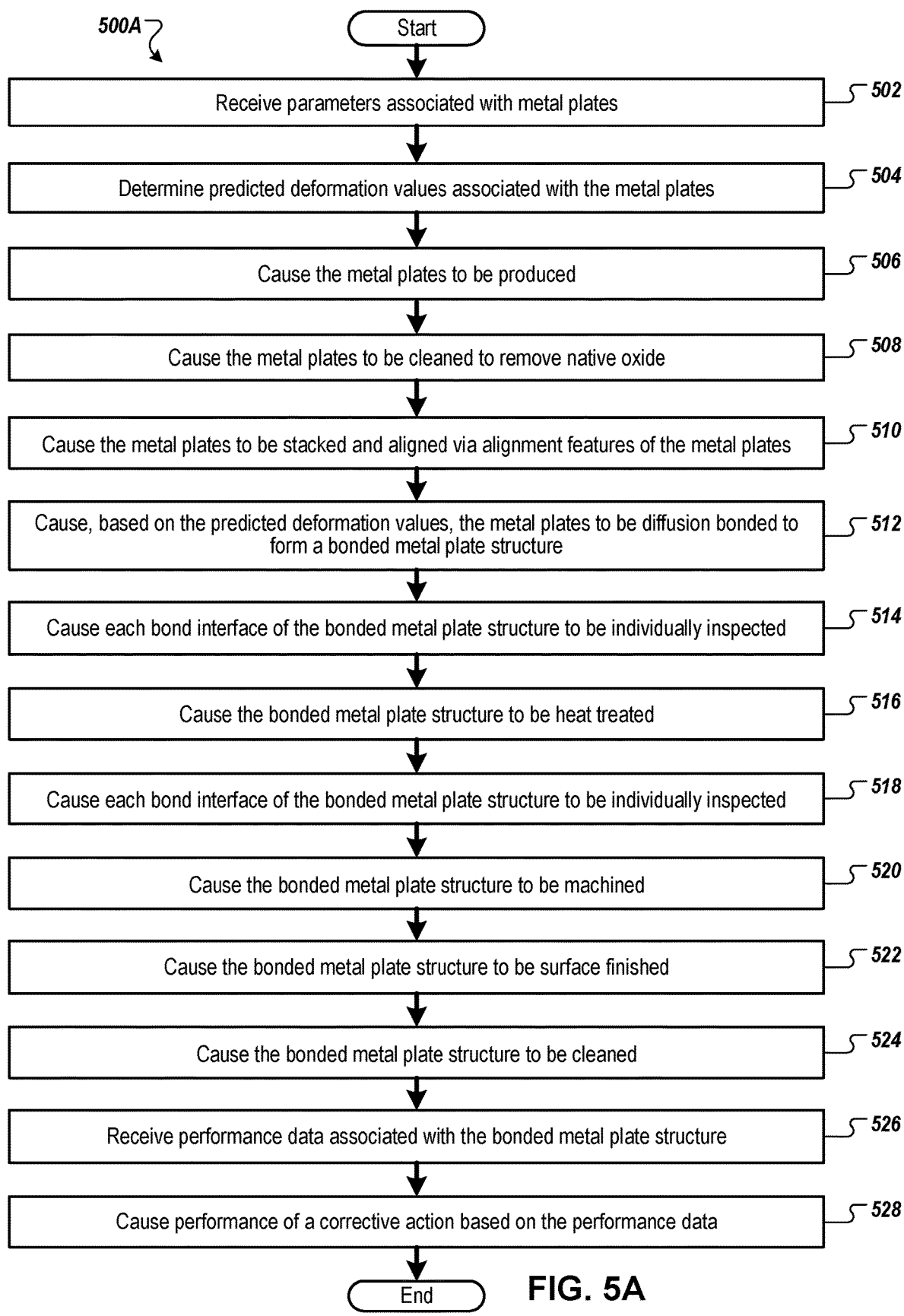
FIGS. 5A-D are flow diagrams of methods associated with production of a bonded metal plate structure, according to certain embodiments.

FIG. 5A is a flow diagram of a method 500A for producing bonded metal plate structures (e.g., bonded metal plate structure 400 of FIG. 4), according to certain embodiments.

Referring to FIG. 5A, in some embodiments, at block 502, the processing logic the processing logic receives parameters associated with metal plates. In some embodiments, the parameters include one or more of dimensions and patterns of the metal plates (e.g., height, width, thickness, hole patterns, recess patterns, and/or the like), design of the metal plates, pressure (e.g., a pressure value, a pressure range) for diffusion bonding the metal plates, temperature (e.g., a temperature value, a temperature range) for diffusion bonding the metal plates, subsets of the metal plates to diffusion bond separately, cooling rate for heat treating the bonded metal plate structure, comparison parameters for comparing inspection data with threshold data (e.g., threshold deformation), threshold data (e.g., threshold deformation), and/or the like. In some embodiments, the parameters are received via user input. In some embodiments, the parameters are generated based on output of a trained machine learning model.

At block 504, the processing logic determines predicted deformation values (e.g., total deformation, vertical deformation, deformation of internal structures, etc.) associated with the metal plates. In some embodiments, the predicted deformation values are based on a pressure value or range of pressure values (e.g., 10 to 120 megapascals (MPa)) and dimensions of the metal plates (e.g., dimensions of the alignment features, dimensions of the holes and recesses, height dimension, diameter dimension, thickness dimension, width dimension, etc.). In some embodiments, the processing logic determines the predicted deformation by providing data input (e.g., pressure and dimensions of the metal plates) to a trained machine learning model (e.g., stress model) and determining the predicted deformation based on the output of the trained machine learning model. In some embodiments, one or more deformation values are determined for each metal plate (e.g., each metal plate is modeled individually). In some embodiments, the predicted deformation values include one or more of a predicted deflection (e.g., distance), predicted stress, predicted strain, predicted permanent deformation (e.g., plastic deformation), and/or the like.

In some embodiments, the processing logic performs stress modeling to identify locations of stress concentration and predicted deformation (e.g., to determine a pressure to be applied during the diffusion bonding).

At block 506, the processing logic causes the metal plates to be produced. In some embodiments, the metal plates are produced via one or more of machining, casting, and/or powder processing (e.g., powder metallurgy). In some embodiments, holes and/or recesses are formed (e.g., machined, drilled, laser drilled, mechanically drilled, drilled for about a 1-10 aspect ratio, molded, casted) in the metal plates. In some embodiments, alignment features (e.g., recesses, alignment pins) are formed (e.g., drilled, machined) and/or disposed (e.g., pressure fit) in the metal plates. In some embodiments, the processing logic causes flatness and roughness of the flat surfaces (e.g., surfaces that are to be bonded) to be controlled.

At block 508, the processing logic causes the metal plates to be cleaned to remove native oxide. In some embodiments, the processing logic causes the metal plates to be chemically cleaned. In some embodiments, the metal plates are vacuum sealed responsive to the cleaning to prevent native oxide from forming on the metal plates. In some embodiments, the native oxide is removed and/or disrupted for bonding of the metal plates to each other.

At block 510, the processing logic causes the metal plates to be stacked and aligned via alignment features (e.g., recesses and protrusions) of the metal plates. In some embodiments, the alignment features align the holes and/or recesses of each metal plate with holes and/or recesses of one or more other metal plates. In some embodiments, two or more metal plates have different patterns of holes and/or recesses.

At block 512, the processing logic causes, based on the predicted deformation values, the metal plates to be diffusion bonded (e.g., bonding of aluminum plate to aluminum plate) to form a bonded metal plate structure (e.g., using the parameters of block 502, such as pressure, temperature, etc.). In some embodiments, the processing logic determines whether the predicted deformation values meet (e.g., do not exceed) a threshold deformation value. Responsive to the predicted deformation values meeting (e.g., not exceeding) a threshold deformation value (e.g., distance corresponding to a thickness of a gasket, such as an O-ring, being used), the metal plates are diffusion bonded together all at once at a first pressure (e.g., at a higher pressure). Responsive to the predicted deformation values not meeting (e.g., exceeding) a threshold deformation value, the processing logic determines a first subset of the metal plates and a second subset of the metal plates to be diffusion bonded separately (e.g., at one or more second pressures that are lower than the first pressure), causes the first subset to be diffusion bonded to form a first bonded structure, causes the second subset to be diffusion bonded to form a second bonded structure, and causes the first bonded structure and the second boned structure to be diffusion bonded to form the bonded metal plate structure. In some embodiments, diffusion bonding less metal plates together at the same time uses less pressure than diffusion bonding more metal plates together at the same time. In some embodiments, a pressure (e.g., updated pressure) for diffusion bonding and a quantity of metal plates that are to diffusion bonded at the same time is determined based on the predicted deformation values of block 504. In some embodiments, the diffusion bonding is at a substantially uniform pressure and/or a substantially uniform temperature across all interfaces that are to be bonded.

In some embodiments, the metal plates are diffusion bonded at 500 to 600 degrees Celsius for 8 to 10 hours in an inert atmosphere.

In some embodiments, one or more operations are used instead of or in addition to the diffusion bonding, such as hot isostatic pressing (HIP).

At block 514, the processing logic causes each bond interface (e.g., bond interfaces 404 of FIG. 4C) of the bonded metal plate structure to be individually inspected to determine performance data (e.g., predicted performance data) of the bonded metal plate structure. In some embodiments, each bond interface is inspected using one or more of SAM inspection, ultrasonic inspection, x-ray inspection, and/or computed tomography (CT) inspection.

In some embodiments each of the bond interfaces (e.g., eight bond interfaces where nine metal plates were diffusion bonded) is inspected separately (e.g., via non-destructive inspection, such as SAM, ultrasonic, x-ray, and/or CT).

In some embodiments, the performance data is compared to threshold data based on comparison parameters. In some embodiments, the performance data includes an image (e.g., scan) of the bonding interface (e.g., see FIG. 4D) and the threshold data is a threshold image of a bonding interface (e.g., image of a bonding interface of a bonded metal plate structure that is labeled as correctly functioning, see FIG. 4E). The image can be compared to the threshold image pixel by pixel to determine a variation.

Responsive to the performance data not meeting a threshold value, flow of method 500A continues. Responsive to the performance data not meeting a threshold value, a corrective action is performed (e.g., re-processing the bonded metal plate structure, discarding the bonded metal plate structure, providing an alert, interrupting production of bonded metal plate structures, updating parameters of block 502, etc.).

At block 516, the processing logic causes the bonded metal plate structure to be heat treated (e.g., at the parameters of block 402, cooled at a cooling rate) in an inert atmosphere. In some embodiments, the bonded metal plate structure is heat treated by cooling the bonded metal plate structure at a cooling rate within the manufacturing equipment (e.g., chamber, furnace, etc.) where the diffusion bonding of the metal plates occurred without removing the bonded metal plate structure. In some embodiments, the bonded metal plate structure is heat treated by re-heating the bonded metal plate structure and cooling the re-heated bonded metal plate structure at a cooling rate. In some embodiments, the bonded metal plate structure is heat treated by cooling the bonded metal plate structure in a gas (e.g., inert gas) or a liquid.

At block 518, the processing logic causes each bond interface of the bonded metal plate structure to be individually inspected. Block 518 is similar to block 514. In some embodiments, one or more bond interfaces of the bonded metal plate structure is individually inspected after any of blocks 520-524.

At block 520, the processing logic may cause the bonded metal plate structure to be machined. At block 520, one or more exterior surfaces of the bonded metal plate structure may be machined. One or machining operations occur at block 506 (e.g., pre-diffusion bonding and pre-heat treating machining operations, exterior surface and/or interior surface machining, hole and/or recess machining, alignment feature machining) and one or more machining operations occur at block 520 (e.g., post-diffusion bonding and post-heat treating machining operations, exterior surface machining). In some embodiments, the holes of the bonded metal plate structure are covered to prevent debris from going in the bonded metal plate structure (e.g., in the faceplate plenum). In some embodiments, back flow of fluid (e.g., water) is used to flush out and prevent machining chips from going inside the bonded metal plate structure (e.g., prevent from going inside the plenum).

At block 522, the processing logic causes the bonded metal plate structure to be surface finished. In some embodiments, the surface finishing is manually performed with backflow. In some embodiments, the surface finishing is via laser texturing.

At block 524, the processing logic causes the bonded metal plate structure to be cleaned (e.g., cleaning internal and external surfaces of the bonded metal plate structure). In some embodiments, the cleaning is via flushing (e.g., via push and pull fluid flow operations). In some embodiments, the cleaning is via cyclical nucleation (CnP).

At block 526, the processing logic receives performance data associated with the bonded metal plate structure. In some embodiments, the performance data is received via the inspecting of bond interfaces (e.g., blocks 514 and/or 518, the performance data is associated with an image of the bond interface, such as image 420 of FIG. 4D.) In some embodiments, performance data is received responsive of use of the bonded metal plate structure (e.g., flow rate, gas purge time, substrate quality, amount of time to process a substrate, substrate yield, leak testing data, etc.).

In some embodiments, the performance data is predictive data. The parameters of block 502 are provided to a trained machine learning model and the predictive data (e.g., performance data) is based on the output of the trained machine learning model.

At block 528, the processing logic causes performance of a corrective action based on the performance data. In some embodiments, the corrective action includes updating one or more parameters (e.g., of block 502) based on the performance data. In some embodiments, the corrective action includes re-training a trained machine learning model based on data input of the parameters of block 502 and target output of the performance data of block 526 and the re-trained machine learning model is used for future iterations of method 500. In some embodiments, the corrective action includes discarding the bonded metal plate structure. In some embodiments, the corrective action includes interrupting operation of manufacturing equipment that is producing bonded metal plate structures and/or manufacturing equipment (e.g., processing chamber, substrate processing system) that is using the bonded metal plate structure. In some embodiments, the corrective action includes providing an alert.

In some embodiments, block 528 occurs responsive to the performance data of block 526 not meeting threshold data (e.g., a corrective action is performed responsive to the performance data values exceeding threshold data values).

Figure 5B:
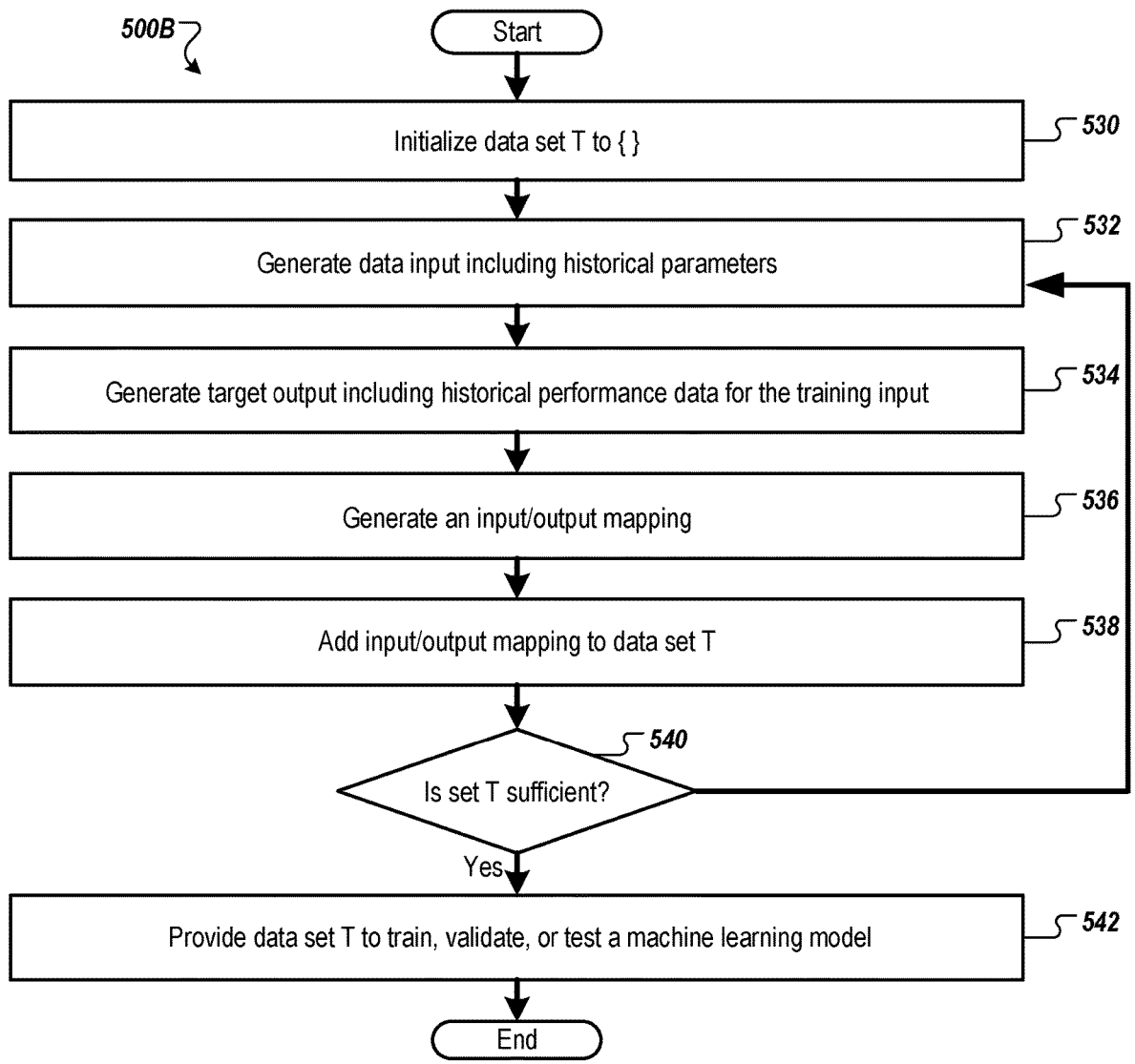

FIG. 5B is a flow diagram of a method 500B for generating a data set for a machine learning model for generating predictive data (e.g., predictive data 168 of FIG. 1), according to certain embodiments.

Referring to FIG. 5B, in some embodiments, at block 530 the processing logic implementing method 500B initializes a training set T to an empty set.

At block 532, processing logic generates first data input (e.g., first training input, first validating input) that includes parameters (e.g., historical parameters 144 of FIG. 1, historical parameters 244 of FIG. 2). In some embodiments, the first data input includes a first set of features for types of parameters and a second data input includes a second set of features for types of parameters (e.g., as described with respect to FIG. 2).

At block 534, processing logic generates a first target output for one or more of the data inputs (e.g., first data input). In some embodiments, the first target output is historical performance data (e.g., historical performance data 162 of FIG. 1, historical performance data 262 of FIG. 2).

At block 536, processing logic optionally generates mapping data that is indicative of an input/output mapping. The input/output mapping (or mapping data) refers to the data input (e.g., one or more of the data inputs described herein), the target output for the data input (e.g., where the target output identifies historical performance data 162), and an association between the data input(s) and the target output.

At block 538, processing logic adds the mapping data generated at block 536 to data set T.

At block 540, processing logic branches based on whether data set T is sufficient for at least one of training, validating, and/or testing machine learning model 190. If so, execution proceeds to block 542, otherwise, execution continues back at block 532. It should be noted that in some embodiments, the sufficiency of data set T is determined based simply on the number of input/output mappings in the data set, while in some other implementations, the sufficiency of data set T is determined based on one or more other criteria (e.g., a measure of diversity of the data examples, accuracy, etc.) in addition to, or instead of, the number of input/output mappings.

At block 542, processing logic provides data set T (e.g., to server machine 180) to train, validate, and/or test machine learning model 190. In some embodiments, data set T is a training set and is provided to training engine 182 of server machine 180 to perform the training. In some embodiments, data set T is a validation set and is provided to validation engine 184 of server machine 180 to perform the validating. In some embodiments, data set T is a testing set and is provided to testing engine 186 of server machine 180 to perform the testing. In the case of a neural network, for example, input values of a given input/output mapping (e.g., numerical values associated with data inputs 210) are input to the neural network, and output values (e.g., numerical values associated with target outputs 220) of the input/output mapping are stored in the output nodes of the neural network. The connection weights in the neural network are then adjusted in accordance with a learning algorithm (e.g., back propagation, etc.), and the procedure is repeated for the other input/output mappings in data set T. After block 542, machine learning model (e.g., machine learning model 190) can be at least one of trained using training engine 182 of server machine 180, validated using validating engine 184 of server machine 180, or tested using testing engine 186 of server machine 180. The trained machine learning model is implemented by predictive component 114 (of predictive server 112) to generate predictive data 168 for performing corrective action associated with the manufacturing equipment 124.

Figure 5C:
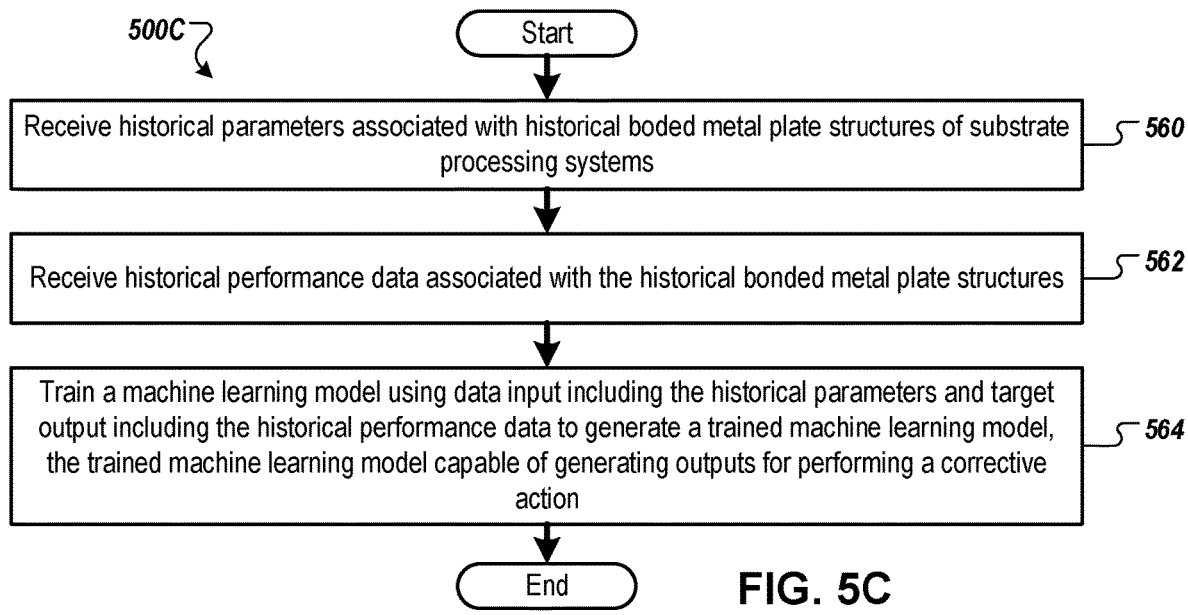

FIG. 5C is a method for training a machine learning model (e.g., model 190 of FIG. 1) for determining predictive data (e.g., predictive data 168 of FIG. 1) to perform a corrective action.

Referring to FIG. 5C, at block 560 of method 500C, the processing logic receives sets of historical parameters (e.g., historical parameters 144 of FIG. 1) associated with historical bonded metal plate structures of one or more substrate processing systems.

At block 562, the processing logic receives sets of historical performance data (e.g., historical performance data 162 of FIG. 1) associated with the historical bonded metal plate structures. Each of the sets of the historical performance data corresponds to a respective set of historical parameters of the sets of historical parameters. In some embodiments, the historical performance data is indicative of whether the corresponding bonded metal plate structure is properly diffusion bonded, properly heat treated, properly functioning, and/or the like. In some embodiments, the historical performance data is indicative of an absolute value or relative value.

At block 564, the processing logic trains a machine learning model using data input including the sets of historical parameters and target output including the historical performance data to generate a trained machine learning model. The trained machine learning model is capable of generating outputs indicative of predictive data (e.g., predictive data 168) to cause performance of one or more corrective actions associated with production of bonded metal plate structures of substrate processing systems.

Figure 5D:
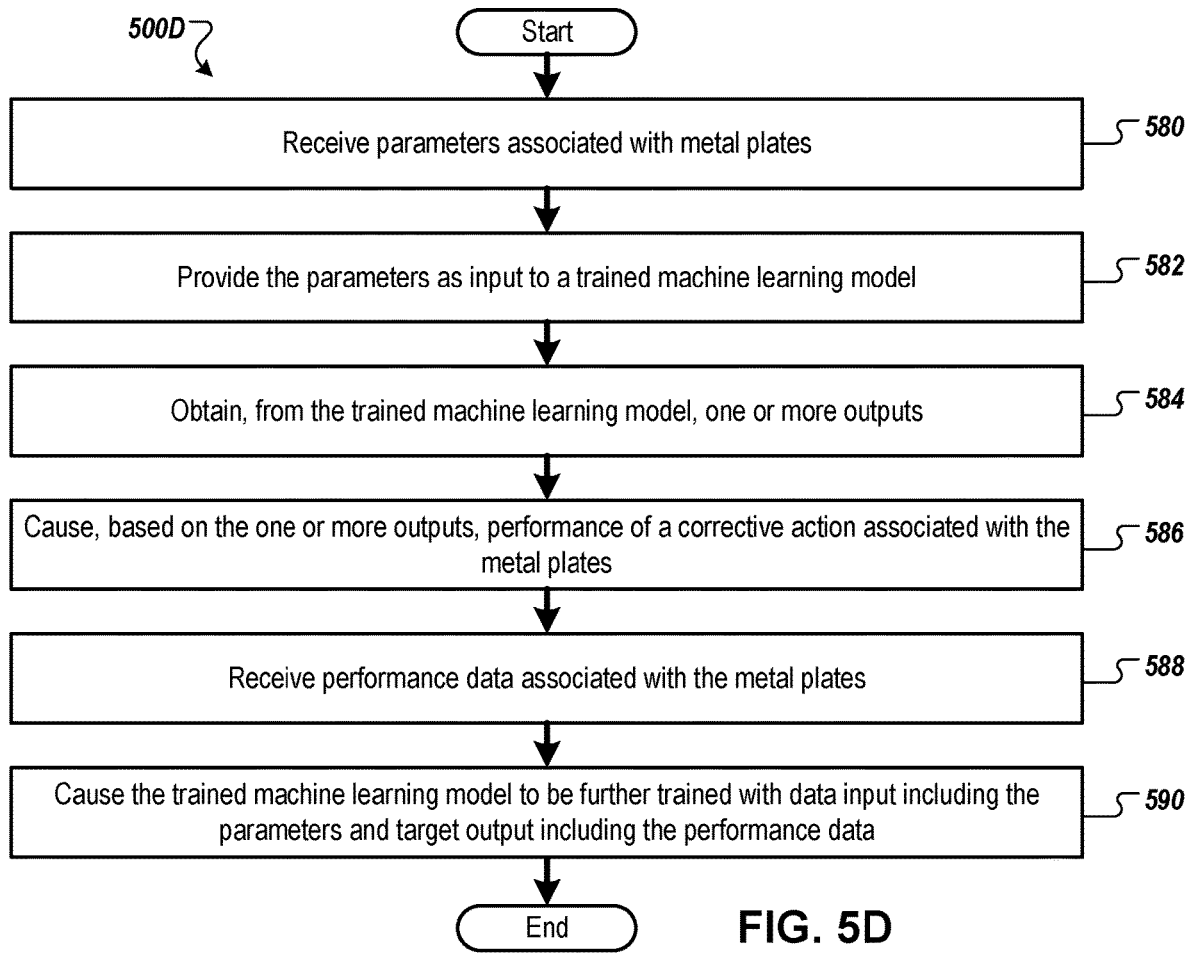

FIG. 5D is a method 500D for using a trained machine learning model (e.g., model 190 of FIG. 1) to cause performance of a corrective action.

Referring to FIG. 5D, at block 580 of method 500D, the processing logic receives sets of parameters (e.g., current parameters 152 of FIG. 1) associated with metal plates (e.g., associated with production of a bonded metal plate structure of a substrate processing system). In some embodiments, block 580 is similar to block 502 of FIG. 5A.

At block 582, the processing logic provides the sets of parameters as input to a trained machine learning model (e.g., the trained machine learning model of block 564 of FIG. 5C).

At block 584, the processing logic obtains, from the trained machine learning model, one or more outputs indicative of predictive data (e.g., predictive data 168 of FIG. 1).

At block 586, the processing logic causes, based on the one or more outputs (e.g., predictive data), performance of a corrective action associated with the metal plates (e.g., production of bonded metal plate structures). In some embodiments, the corrective action of block 586 may be similar to a corrective action of block 528 of FIG. 5A. In some embodiments, the corrective action includes updating one or more parameters of block 582. In some embodiments, the corrective action includes diffusion bonding two or more subsets of the metal plates together (e.g., at a lower pressure than bonding all of the metal plates together at the same time) to form bonded subset structures and bonding the bonded subset structures together (e.g., at a lower pressure than bonding all of the metal plates together at the same time).

In some embodiments, the parameters are design of the metal plates and the predictive data (e.g., predicted performance data) is a predicted flow value (e.g., flow rate, time to complete flow, etc.). In some embodiments, the parameters are a pressure value and dimensions of the metal plates and the predictive data (e.g., predicted performance data) is predicted deformation values. In some embodiments, the parameters include one or more of a pressure value for diffusion bonding, a temperature value for diffusion bonding, comparison parameters for comparing inspection data with threshold data, a cooling rate of heat treating the bonded metal plate structure, and/or the like. In some embodiments, the predictive data (e.g., predicted performance data) is performance data associated with one or more of variation of an image of the bond interface from a threshold image or use of the bonded metal plates structure (e.g., flow data, substrate defects, yield, etc.).

At block 588, processing logic receives performance data (e.g., current performance data 164 of FIG. 1) associated with the metal plates (e.g., inspection data of bonded metal plate structure, metrology data of bonded metal plate structure, usage data of bonded metal plate structure, etc.). In some embodiments, block 588 is similar to block 526 of FIG. 5A.

At block 590, processing logic causes the trained machine learning model to be further trained (e.g., re-trained) with data input including the sets of parameters (e.g., from block 580) and target output including the performance data (e.g., from block 588).

In some embodiments, one or more of blocks 580-590 are repeated until the one or more outputs (e.g., predictive data) indicates that no further corrective actions are to be performed.

Figure 6:
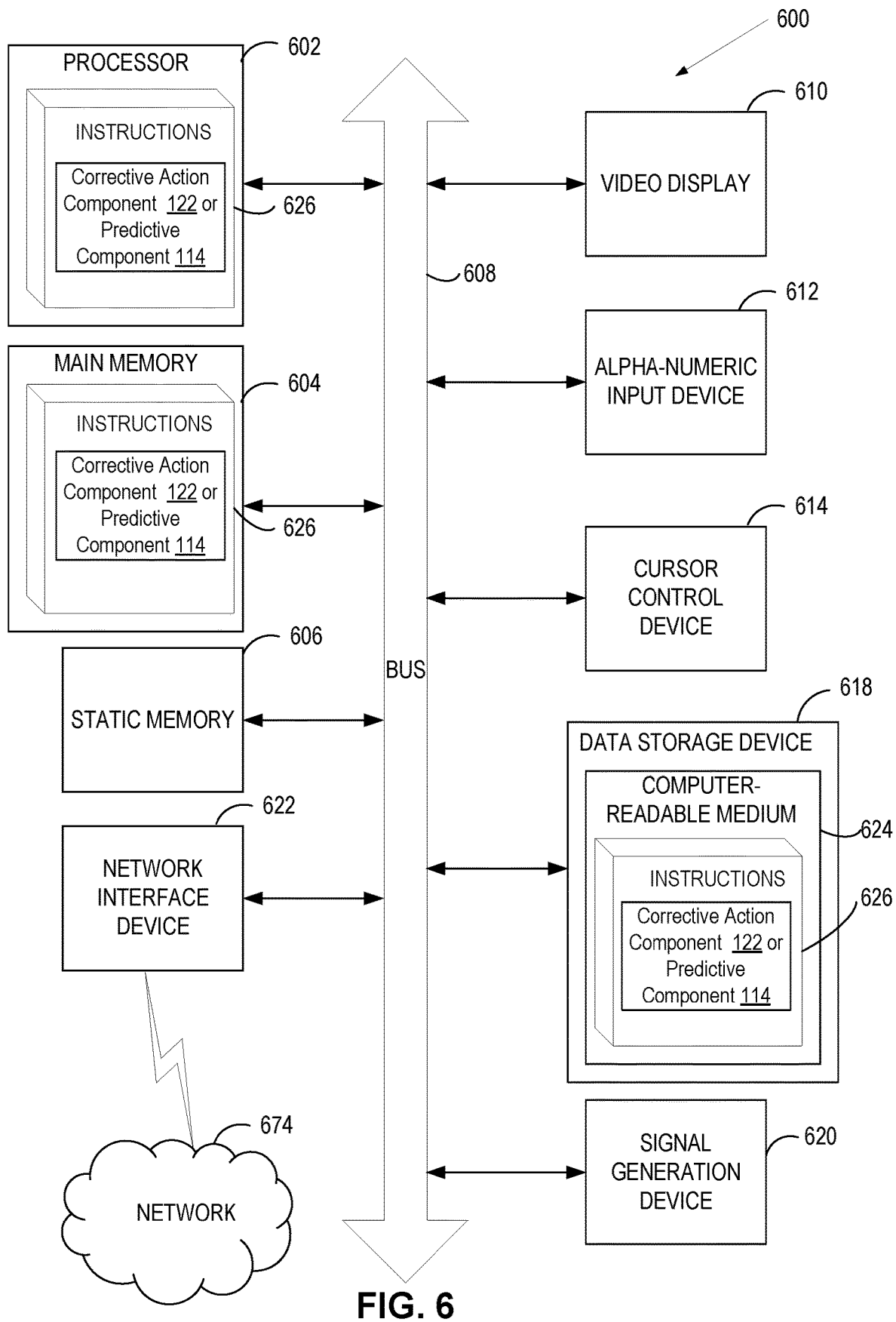
FIG. 6 is a block diagram illustrating a computer system, according to certain embodiments.

FIG. 6 is a block diagram illustrating a computer system 600, according to certain embodiments. In some embodiments, the computer system 600 is one or more of client device 120, predictive system 110, server machine 170, server machine 180, or predictive server 112.

In some embodiments, computer system 600 is connected (e.g., via a network, such as a Local Area Network (LAN), an intranet, an extranet, or the Internet) to other computer systems. In some embodiments, computer system 600 operates in the capacity of a server or a client computer in a client-server environment, or as a peer computer in a peer-to-peer or distributed network environment. In some embodiments, computer system 600 is provided by a personal computer (PC), a tablet PC, a Set-Top Box (STB), a Personal Digital Assistant (PDA), a cellular telephone, a web appliance, a server, a network router, switch or bridge, or any device capable of executing a set of instructions (sequential or otherwise) that specify actions to be taken by that device. Further, the term "computer" shall include any collection of computers that individually or jointly execute a set (or multiple sets) of instructions to perform any one or more of the methods described herein.

In a further aspect, the computer system 600 includes a processing device 602, a volatile memory 604 (e.g., Random Access Memory (RAM)), a non-volatile memory 606 (e.g., Read-Only Memory (ROM) or Electrically-Erasable Programmable ROM (EEPROM)), and a data storage device 616, which communicate with each other via a bus 608.

In some embodiments, processing device 602 is provided by one or more processors such as a general purpose processor (such as, for example, a Complex Instruction Set Computing (CISC) microprocessor, a Reduced Instruction Set Computing (RISC) microprocessor, a Very Long Instruction Word (VLIW) microprocessor, a microprocessor implementing other types of instruction sets, or a microprocessor implementing a combination of types of instruction sets) or a specialized processor (such as, for example, an Application Specific Integrated Circuit (ASIC), a Field Programmable Gate Array (FPGA), a Digital Signal Processor (DSP), or a network processor).

In some embodiments, computer system 600 further includes a network interface device 622 (e.g., coupled to network 674). In some embodiments, computer system 600 also includes a video display unit 610 (e.g., an LCD), an alphanumeric input device 612 (e.g., a keyboard), a cursor control device 614 (e.g., a mouse), and a signal generation device 620.

In some implementations, data storage device 616 includes a non-transitory computer-readable storage medium 624 on which store instructions 626 encoding any one or more of the methods or functions described herein, including instructions encoding components of FIG. 1 (e.g., corrective action component 122, predictive component 114, etc.) and for implementing methods described herein (e.g., one or more of methods 500A-D).

In some embodiments, instructions 626 also reside, completely or partially, within volatile memory 604 and/or within processing device 602 during execution thereof by computer system 600, hence, in some embodiments, volatile memory 604 and processing device 602 also constitute machine-readable storage media.

While computer-readable storage medium 624 is shown in the illustrative examples as a single medium, the term "computer-readable storage medium" shall include a single medium or multiple media (e.g., a centralized or distributed database, and/or associated caches and servers) that store the one or more sets of executable instructions. The term "computer-readable storage medium" shall also include any tangible medium that is capable of storing or encoding a set of instructions for execution by a computer that cause the computer to perform any one or more of the methods described herein. The term "computer-readable storage medium" shall include, but not be limited to, solid-state memories, optical media, and magnetic media.

In some embodiments, the methods, components, and features described herein are implemented by discrete hardware components or are integrated in the functionality of other hardware components such as ASICS, FPGAs, DSPs or similar devices. In some embodiments, the methods, components, and features are implemented by firmware modules or functional circuitry within hardware devices. In some embodiments, the methods, components, and features are implemented in any combination of hardware devices and computer program components, or in computer programs.

Unless specifically stated otherwise, terms such as "receiving," "determining," "causing," "training," "providing," "obtaining," "updating," "interrupting," "re-training," "inspecting," "using," or the like, refer to actions and processes performed or implemented by computer systems that manipulates and transforms data represented as physical (electronic) quantities within the computer system registers and memories into other data similarly represented as physical quantities within the computer system memories or registers or other such information storage, transmission or display devices. In some embodiments, the terms "first," "second," "third," "fourth," etc. as used herein are meant as labels to distinguish among different elements and do not have an ordinal meaning according to their numerical designation.

Examples described herein also relate to an apparatus for performing the methods described herein. In some embodiments, this apparatus is specially constructed for performing the methods described herein, or includes a general purpose computer system selectively programmed by a computer program stored in the computer system. Such a computer program is stored in a computer-readable tangible storage medium.

The methods and illustrative examples described herein are not inherently related to any particular computer or other apparatus. In some embodiments, various general purpose systems are used in accordance with the teachings described herein. In some embodiments, a more specialized apparatus is constructed to perform methods described herein and/or each of their individual functions, routines, subroutines, or operations. Examples of the structure for a variety of these systems are set forth in the description above.

The above description is intended to be illustrative, and not restrictive. Although the present disclosure has been described with references to specific illustrative examples and implementations, it will be recognized that the present disclosure is not limited to the examples and implementations described. The scope of the disclosure should be determined with reference to the following claims, along with the full scope of equivalents to which the claims are entitled.

The invention claimed is:

1. A method comprising:
receiving one or more parameters associated with a plurality of metal plates;
determining, based on the one or more parameters, a plurality of predicted deformation values associated with the plurality of metal plates, each of the plurality of predicted deformation values corresponding to a corresponding metal plate of the plurality of metal plates; and
causing, based on the plurality of predicted deformation values, the plurality of metal plates to be diffusion bonded to produce a bonded metal plate structure.

2. The method of claim 1, wherein the bonded metal plate structure is a showerhead for chemical vapor deposition (CVD) or atomic layer deposition (ALD) in a processing chamber of a substrate processing system, and wherein the showerhead has a gas purge time of about 0.2 seconds or less.

3. The method of claim 1, wherein the causing of the plurality of metal plates to be diffusion bonded comprises:
determining, based on the plurality of predicted deformation values, a first subset of the plurality of metal plates and a second subset of the plurality of metal plates to be diffusion bonded separately;
causing the first subset to be diffusion bonded to form a first bonded structure;
causing the second subset to be diffusion bonded to form a second bonded structure; and
causing the first bonded structure and the second bonded structure to be diffusion bonded to form the bonded metal plate structure.

4. The method of claim 1, wherein a first metal plate of the plurality of metal plates has first hole pattern that is different from a second hole pattern of a second metal plate of the plurality of metal plates, and wherein the causing of the plurality of metal plates to be diffusion bonded forms isolated plenums in the bonded metal plate structure without using seals and without using gaskets.

5. The method of claim 1 further comprising:
receiving historical parameters associated with historical bonded metal plate structures;
receiving historical performance data associated with the historical bonded metal plate structures; and
training a machine learning model with data input comprising the historical parameters and target output comprising the historical performance data to generate a trained machine learning model, the trained machine learning model being capable of generating one or more outputs, and wherein one or more corrective actions associated with one or more bonded metal plate structures are to be performed based on the one or more outputs.

6. The method of claim 1 further comprising:
providing the one or more parameters as input to a trained machine learning model; and
obtaining, from the trained machine learning model, one or more outputs indicative of predicted performance data, wherein one or more corrective actions associated with the bonded metal plate structure are to be performed based on the predicted performance data.

7. The method of claim 6, wherein the trained machine learning model is a stress model, wherein the one or more parameters comprise a pressure value and dimensions of the plurality of metal plates, and wherein the predicted performance data comprises the plurality of predicted deformation values.

8. The method of claim 6, wherein the one or more parameters comprise design of the plurality of metal plates and the predicted performance data comprises a predicted flow value.

9. The method of claim 6, wherein the one or more parameters comprise one or more of:
a pressure value for diffusion bonding of the plurality of metal plates;
a temperature value for the diffusion bonding of the plurality of metal plates;
comparison parameters associated with comparing inspection data of each bond interface of the bonded metal plate structure with threshold data; or
a cooling rate of heat treating the bonded metal plate structure subsequent to the plurality of metal plates being diffusion bonded.

10. The method of claim 6, wherein the one or more corrective actions comprise one or more of:
updating at least one of the one or more parameters for production of bonded metal plate structures;
providing an alert associated with the production of the bonded metal plate structures; or
interrupting the production of the bonded metal plate structures.

11. The method of claim 6 further comprising:
receiving performance data associated with the bonded metal plate structure; and
re-training the trained machine learning model with data input comprising the one or more parameters and target output comprising the performance data.

12. The method of claim 11, wherein the performance data is associated with one or more of:
individually inspecting each bond interface of the bonded metal plate structure, wherein the individually inspecting is via one or more of scanning acoustic microscopy (SAM), ultrasonic inspection, x-ray inspection, or computed tomography inspection; or
use of the bonded metal plate structure in a substrate processing system.

13. A non-transitory machine-readable storage medium storing instructions which, when executed cause a processing device to perform operations comprising:
receiving one or more parameters associated with a plurality of metal plates;
determining, based on the one or more parameters, a plurality of predicted deformation values associated with the plurality of metal plates, each of the plurality of predicted deformation values corresponding to a corresponding metal plate of the plurality of metal plates; and
causing, based on the plurality of predicted deformation values, the plurality of metal plates to be diffusion bonded to produce a bonded metal plate structure.

14. The non-transitory machine-readable storage medium of claim 13, wherein the bonded metal plate structure is a showerhead for chemical vapor deposition (CVD) or atomic layer deposition (ALD) in a processing chamber of a substrate processing system, and wherein the showerhead has a gas purge time of about 0.2 seconds or less.

15. The non-transitory machine-readable storage medium of claim 13, wherein the causing of the plurality of metal plates to be diffusion bonded comprises:
determining, based on the plurality of predicted deformation values, a first subset of the plurality of metal plates and a second subset of the plurality of metal plates to be diffusion bonded separately;
causing the first subset to be diffusion bonded to form a first bonded structure;
causing the second subset to be diffusion bonded to form a second bonded structure; and
causing the first bonded structure and the second bonded structure to be diffusion bonded to form the bonded metal plate structure.

16. The non-transitory machine-readable storage medium of claim 13, wherein a first metal plate of the plurality of metal plates has first hole pattern that is different from a second hole pattern of a second metal plate of the plurality of metal plates, and wherein the causing of the plurality of metal plates to be diffusion bonded forms isolated plenums in the bonded metal plate structure without using seals and without using gaskets.

17. A system comprising:
a memory; and
a processing device coupled to the memory, wherein the processing device is to:
receive one or more parameters associated with a plurality of metal plates;
determine, based on the one or more parameters, a plurality of predicted deformation values associated with the plurality of metal plates, each of the plurality of predicted deformation values corresponding to a corresponding metal plate of the plurality of metal plates; and
cause, based on the plurality of predicted deformation values, the plurality of metal plates to be diffusion bonded to produce a bonded metal plate structure.

18. The system of claim 17, wherein the bonded metal plate structure is a showerhead for chemical vapor deposition (CVD) or atomic layer deposition (ALD) in a processing chamber of a substrate processing system, and wherein the showerhead has a gas purge time of about 0.2 seconds or less.

19. The system of claim 17, wherein to cause the plurality of metal plates to be diffusion bonded, the processing device is to:
determine, based on the plurality of predicted deformation values, a first subset of the plurality of metal plates and a second subset of the plurality of metal plates to be diffusion bonded separately;
cause the first subset to be diffusion bonded to form a first bonded structure;
cause the second subset to be diffusion bonded to form a second bonded structure; and
cause the first bonded structure and the second bonded structure to be diffusion bonded to form the bonded metal plate structure.

20. The system of claim 17, wherein a first metal plate of the plurality of metal plates has first hole pattern that is different from a second hole pattern of a second metal plate of the plurality of metal plates, and wherein to cause the plurality of metal plates to be diffusion bonded, the processing device is to form isolated plenums in the bonded metal plate structure without using seals and without using gaskets.

* * * * *